US007268361B2

(12) United States Patent
Adamec et al.

(10) Patent No.: US 7,268,361 B2
(45) Date of Patent: Sep. 11, 2007

(54) ELECTRON EMISSION DEVICE

(75) Inventors: Pavel Adamec, Heimstetten (DE); Dieter Winkler, Heimstetten (DE)

(73) Assignee: ICT, Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 52 days.

(21) Appl. No.: 10/483,114

(22) PCT Filed: Jul. 1, 2002

(86) PCT No.: PCT/EP02/07247

§ 371 (c)(1),
(2), (4) Date: Jul. 26, 2004

(87) PCT Pub. No.: WO03/005398

PCT Pub. Date: Jan. 16, 2003

(65) Prior Publication Data

US 2004/0238809 A1 Dec. 2, 2004

(30) Foreign Application Priority Data

Jul. 6, 2001 (EP) ................................ 01116403

(51) Int. Cl.
*H01L 29/06* (2006.01)
*H01L 21/00* (2006.01)

(52) U.S. Cl. ........................... 257/10; 257/11; 257/77; 257/84; 313/309; 313/336; 315/5; 315/169.1; 315/169.3

(58) Field of Classification Search ..................... None
See application file for complete search history.

(56) References Cited

U.S. PATENT DOCUMENTS 4,513,308 A 4/1985 Greene et al. ................ 357/55

(Continued)

OTHER PUBLICATIONS

Kanemaru, et al., "Control of Emission Currents from Silicon Field Emitter Arrays Using a Built-in MOSFET," Appl. Sur. Sci. 111 (1997) 218-223.

(Continued)

*Primary Examiner*—Sue A. Purvis
*Assistant Examiner*—Fazli Erdem
(74) *Attorney, Agent, or Firm*—Patterson & Sheridan, LLP

(57) ABSTRACT

The invention provides an electron beam device 1 comprising at least one field emission cathode 3 and at least one extracting electrode 5, whereby the field emission cathode 5 comprises a p-type semiconductor region 7 connected to an emitter tip 9 made of a semiconductor material, an n-type semiconductor region 11 forming a pn-diode junction 13 with the p-type semiconductor region 7 a first electric contact 15 on the p-type semiconductor region 7 and a second electric contact 17 on the n-type semiconductor region 11. The p-type semiconductor region 7 prevents the flux of free electrons to the emitter unless electrons are injected into the p-type semiconductor region 7 by the pn-diode junction 13. This way, the field emission cathode 3 can generate an electron beam where the electron beam current is controlled by the forward biasing second voltage V2 across the pn-diode junction. Such electron beam current has an improved current value stability. In addition the electron beam current does not have to be stabilized any-more by adjusting, the voltage between emitter tip 9 and extracting electrode 5 which would interfere with the electric field of electron beam optics. The present invention further provides the field emission cathode as described above and an array of field emission cathodes. The invention further provides a method to generate at least one electron beam.

30 Claims, 24 Drawing Sheets

U.S. PATENT DOCUMENTS

| | | | | |
|---|---|---|---|---|
| 4,766,340 | A | 8/1988 | van der Mast et al. | 313/366 |
| 5,572,041 | A * | 11/1996 | Betsui et al. | 257/10 |
| 5,612,587 | A | 3/1997 | Itoh et al. | 313/309 |
| 5,637,023 | A | 6/1997 | Itoh et al. | 445/24 |
| 5,710,478 | A | 1/1998 | Kanemaru et al. | 313/336 |
| 5,780,318 | A | 7/1998 | Hirano et al. | 438/20 |
| 5,793,154 | A | 8/1998 | Itoh et al. | 313/308 |
| 5,814,924 | A * | 9/1998 | Komatsu | 313/309 |
| 5,828,163 | A | 10/1998 | Jones et al. | 313/336 |
| 5,847,408 | A | 12/1998 | Kanemaru et al. | 257/10 |
| 5,977,719 | A | 11/1999 | Makishima | 315/169.1 |
| 6,020,595 | A | 2/2000 | Itoh et al. | 257/10 |
| 6,046,542 | A | 4/2000 | Silva et al. | 313/497 |
| 6,060,823 | A | 5/2000 | Okamoto et al. | 313/309 |
| 6,084,341 | A | 7/2000 | Takemura | 313/336 |
| 6,087,193 | A | 7/2000 | Gray | 438/20 |
| 6,163,107 | A | 12/2000 | Itoh et al. | 313/496 |
| 6,326,729 | B1 * | 12/2001 | Yokoo et al. | 315/5 |

OTHER PUBLICATIONS

Matsukawa, et al., "Optimization of Transistor Structure for Transistor-Stabilized Field Emitter Arrays," IEEE Transactions on Electron Devices, vol. 46, No. 11, Nov. 1999.

Schroder, et al., "The Semiconductor Field-Emission Photocathode," IEEE Transactions on Electron Devices, vol. ED-21, No. 12, Dec. 1974.

International Preliminary Examination Report, dated Mar. 13, 2003, for PCT/EP02/07247.

International Search Report, dated Sep. 10, 2002, for PCT/EP02/07247.

* cited by examiner

ELECTRON EMISSION DEVICE

FIELD OF THE INVENTION

The invention relates to field emission cathodes or arrays of field emission cathodes. It also relates to electron beam devices with field emission cathodes or with arrays of field emission cathodes, and to methods of generating electron beams.

BACKGROUND OF THE INVENTION

Field emission cathodes and arrays of field emission cathodes are known electron beam sources for electron beam devices in applications as diverse as e.g. electron microscopy, electron pattern generators or flat panel displays.

Field emission cathodes emit electrons into free space by applying a high electric field to the surface of the emitter tip of the field emission cathode. Without electric field there is usually a potential barrier of theoretically infinite thickness at the interface of the emitter tip and free space or vacuum.; The height of the potential barrier depends on the surface material of the emitter tip. When an external electric field is applied to the emitter tip that attracts electrons, the potential barrier thickness reduces. When the electric field at the surface of the emitter tip is larger than ca. $10^8$ V/m, the potential barrier thickness reduces to a level where electrons in the emitter tip succeed in tunneling through the potential barrier into free space. This phenomenon is called field emission, in contrast to electron emission caused by e.g. thermal excitation, photo-effect etc.

Usually the high electric field is generated by applying a voltage between the emitter tip and an extracting electrode facing the emitter tip. In order to achieve sufficient field strength at the emitter tip, the electron emitting surface of the emitter is in the shape of a sharp tip (tip radius typically 1 nm to 100 nm). The emitter tip is usually made of metal or semiconductor material.

Among the many advantages of field emission cathodes compared to more traditional electron beam sources, like e.g. tungsten hairpin filaments, are their small emission source size, which is important for electron beams-used for precision focussing applications, their superior brightness, a smaller energy spread of the electrons within the electron beam and a longer lifetime. However, field emission cathodes also have drawbacks because of their need for high vacuum and because of a poor electron emission current stability.

The electron emission current instability is understood to be caused by the extreme sensitivity of the electron emission current on chemical or physical changes of the surface of the emitter tip. With the emitter tip having an apex radius of typically only a few nanometers, a deposition of a few atom layers or tiniest deformations of the apex during operation can cause significant electron emission current changes during operation. Many applications like e.g. electron microscopy, e-beam pattern generators, and other precision devices, require a high electron beam current stability.

To achieve a better electron emission current, some effort has been made to actively regulate the electron emission current by adjusting the voltage between emitter tip and extracting electrode according to the changes of the electron emission current. However this concept has the drawback that for electron beam precision devices like electron microscopes, the voltage changes between extracting electrode and emitter tip interfere with the electric field of the electron beam optics. Such interference can deteriorate the focussing capabilities of precision electron beam devices.

For some time large arrays of field emission cathodes have been integrated onto semiconductor substrates using semiconductor microprocessing techniques. Semiconductor microprocessing techniques allow large arrays of micron-size field emission cathodes to be fabricated onto minimal surface area. In addition, extraction electrodes and/or electronic control circuits for each field emission cathode can be integrated onto the semiconductor substrates in a cost-effective way. Arrays of field emission cathodes are seen to have large commercial potential for many applications, e.g. for flat panel displays as well as for electron microscopy or e-beam pattern generators where parallel operating electron beams can dramatically improve the processing throughput.

The fabrication of field emission cathodes on semiconductor material has several advantages. One reason is that the fabrication of emitter tips from a semiconductor substrate, especially from silicon substrates, is straightforward. Furthermore, semiconductor emitter tips can be doped in order to adjust their electronic properties to a given application. In particular it has been found that the choice of the polarity of the majority carrier of the respective semiconductor material has a profound impact on the emission behavior of emitter tips: n-type semiconductor emitters connected to some voltage source like metallic emitters emit electrons according to the Fowler-Nordheim formula; in contrast p-type emitters connected to some voltage source deviate from the Fowler-Nordheim formula significantly.

The different electron emission current behavior of p-type emitters is thought to be caused by the absence of electron abundance in p-type emitters. Therefore, the emission current can be limited by the number of free electrons in the p-type material, and not by the potential barrier at the surface of the emitter tip. This is contrary to the model of Fowler-Nordheim, where the electron emission current is limited by the potential barrier at the emitter surface.

A detailed study of the different behaviors of p-type emitters and n-type emitters has been performed, e.g. in "Control of emission currents from silicon field emitter arrays using a built-in MOSFET" by Seigo Kanemaru et.al., Applied Surface Science 111 (1997),p.218-223 or "The Semiconductor Field-Emission Photocathode" by Dieter K. Schroder et.al., IEEE Trans. Electr. Dev., Vol ED-21, No 12, Dec. 1974.

In "The Semiconductor Field-Emission Photocathode" by Dieter K. Schroder et.al., the electron emission current limiting effect has been used to design a p-type field emission cathode where the emission rate is controlled by external light that generates electron-hole pairs in the p-type emitter region via photo-effect. The generated electrons diffuse until they recombine or arrive at the emitter surface where they can be emitted with an external electric field. The strength of the external field is so high that, in this model, the emission current is limited by the number of free electrons generated by the external light intensity and not by the tunneling probability through the potential barrier.

An important advantage of generating an electron beam current through light excitation is that the electron beam current can be controlled by the external light intensity without changing the voltage between extracting electrode and emitter tip. This avoids the mentioned problem of interfering with the electric fields of the electron beam optics used for high precision electron beam devices.

The p-type field emission cathode with light excitation however has severe limitations. For one thing, it is costly to install a light source near a field emission cathode with a beam that points to the small emitter tip region. Even when light is coming from behind of the substrate as shown in the above-mentioned paper by D. Schroder, it is difficult to control the stability of the light power to the extent needed for a well-controlled electron beam current. Finally, for a large array of field emission cathodes integrated onto a substrate there seems no easy way to control the emission current individually by the use of external light sources.

SUMMARY OF THE INVENTION

The present invention intends to provide improved electron beam devices, improved field emission cathodes, improved arrays of field emission cathodes as well as improved methods for controlling electron beams. According to one aspect of the present invention an electron beam device is provided as specified in independent claim 1.

According to a second aspect of the present invention an electron beam device is provided as specified in independent claim 11.

According to a fourth aspect of the present invention a field emission cathode is provided as specified in independent claim 17.

According to a sixth aspect of the present invention an array of field emission cathodes is provided as specified in independent claim 23.

Further advantages, features, aspects and details of the invention are evident from the dependent claims, the description and the accompanying drawings. The claims are intended to be understood as a first non-limiting approach of defining the invention in general terms.

The invention according to claim 1 and 11 provides an electron beam device with at least one field emission cathode and at least one extracting electrode, where the electron beam current can be controlled by the second voltage V2 across the pn-diode junction. By having a p-type semiconductor region connected to the emitter tip and by providing a sufficiently high electric field at the surface of the emitter tip the electron beam device can be operated in a mode where the electron emission current is limited by the current injected into the emitter tip through the pn-diode junction. This mode is called saturation mode.

In the saturation mode the emission current is predominately controlled by the electrons injected into p-type semiconductor region, which preferably is controlled by the second voltage V2 across the pn-diode.

According to the invention, the p-type semiconductor region is connected to the emitter tip whereby an electron current entering the emitter tip flows through the p-type semiconductor region. This implies that the current entering the emitter tip is determined by the current that the p-type semiconductor region delivers to the emitter tip. Since p-type semiconductor material per se has essentially no free electrons (except for leakage current) the electron current that the p-type semiconductor region can deliver to the emitter tip preferably depends on the electron current that the n-type semiconductor region injects into the p-type semiconductor region via the forward biased pn-diode. The electron current delivered to the emitter tip for electron emission accordingly depends on a forward biasing voltage across the pn-diode junction.

The p-type semiconductor region has a first electric contact, while the n-type semiconductor region has a second electric contact. Both electric contacts serve to be able to apply a second voltage V2 across the pn-diode junction for controlled current injection. Preferably, both electric contacts are ohmic contacts with a low resistance in order to have good voltage control across the pn-junction. The first electric contact also serves to apply a first voltage V1 between the emitter tip and the extracting electrode which defines the electric field at the emitter tip during operation.

The electron current entering the emitter tip preferably flows through a non-depleted p-type portion. Preferably, the non-depleted p-type portion of the p-type semiconductor region is in ohmic contact with the first electric contact. This way the voltage of the non-depleted p-type portion of the p-type semiconductor region can be controlled by the voltage of the first electric contact. This allows the electron current between the n-type semiconductor region and the p-type semiconductor region to be controlled by the second voltage V2.

In the saturation mode the first voltage V1 is so high that the electron emission current is limited by the pn-diode junction current. Preferably, the electron current through the pn-diode junction is determined by the second voltage V2 across the pn-diode. The saturation mode therefore offers many advantages over previously known field emission cathodes: firstly, emission current instabilities due to changes of surface states and shape of the sharp emitter tip during operation are suppressed; this is because in the saturation mode the electric field at the surface of the emitter tip is so high that injected electrons are emitted into free space independently, whether the surface state or shape of the emitter tip changes during operation or not. Instead, the electron beam current is determined by the electron current injected into the p-type semiconductor region and preferably by the second voltage V2 across the pn-diode, which can be controlled to a very high level of stability.

Secondly, the electron emission current can be controlled without changing the voltage between extracting electrode and emitter, which is important for applications such as electron microscopy or electron beam pattern generators. The focussing properties of high precision electron beam optic systems deteriorate when voltage changes of the extracting electrode or emitter tip interfere with the electrostatic field distribution of the electron beam optic system.

Thirdly, pn-diodes can be easily integrated into field emission cathodes manufactured on a semiconductor substrate using microprocessing technology. Finally, the implementation of pn-diodes to arrays of field emission cathodes integrated on a semiconductor substrate is straightforward.

The extracting electrode serves to generate a high external electric field at the emitter tip which is necessary to enable electrons to tunnel into tree space. Preferably, the extracting electrode faces the emitter tip of the field emission cathode. Preferably, the extracting electrode faces the apex of the emitter tip to generate the highest electric fields there. The apex therefore is preferably the only spot of a field emission cathode which emits the electrons. Its size can be as small as a few nanometers in diameter. With increasing positive first voltage V1 at the extracting electrode with respect to the emitter tip the electric field at the emitter surface increases, which decreases the thickness of the potential barrier. A decreasing thickness of the potential barrier in turn increases the probability that electrons tunnel from the emitter tip into free space.

Preferably, the extracting electrode is at an electric potential with respect to the emitter which is large enough to make electrons tunnel through the potential barrier at a rate much faster than the rate at which electrons are injected into the emitter tip. The higher the emission probability given by the potential barrier between the surface of the emitter tip and free space the less the influence of changes of surface states or shape of the emitter tip during operation to instabilities of the electron beam current. In other words, the higher the emission probability given by the potential barrier between the surface of the emitter tip and free space, the better the control of the electron beam current through the voltage across the pn-diode. For that reason, the extracting electrode is at a voltage with respect to the emitter which generates an electric field at the emitter tip preferably larger than $10^7$ V/m and preferably larger than $10^8$ V/m.

The electron beam is made of the electrons emitted from the emitter tip into free space. While the electron emission current is the current emitted from the emitter into free space, the electron beam represents the emitted electrons traveling along the direction of the electric field. Usually the emitted electrons travel towards the extracting electrode unless other anodes with even higher potentials are within reach. For some electron beam devices the electron beam also splits in a way that some electrons travel towards the extracting electrode while other electrons travel towards other anodes. In this case the electron beam current at the anode may be different from the electron emission current at the emitter tip.

The p-type semiconductor region of the field emission cathode serves several purposes. Firstly, it is in connection with the emitter tip to deliver electrons for electron emission into free space. In the saturation mode the electron emission current is equal to the electron current delivered to the emitter tip by the p-type semiconductor, except for leakage current in the emitter tip. Secondly, the p-type semiconductor region serves as a material where electrons are minority carriers. Therefore, the p-type semiconductor region surrounding the emitter tip cuts off the emitter tip from electron sources other than those coming from the pn-diode junction. This feature enables the pn-diode in the saturation mode (and ignoring leakage current) to have full control of the electron emission current. Thirdly, the p-type semiconductor region represents the p-type portion of the pn-diode that the p-type semiconductor region forms with the n-type semiconductor region. The pn-diode in turn is used, preferably as an electron source, to inject an electron current into the p-type emitter region. Fourthly, the p-type semiconductor region carries the first electric contact which a) holds the emitter tip at a defined first voltage V1 with respect to the extracting electrode; b) holds the non-depleted p-type portion at a defined second voltage V2 with respect to the n-type semiconductor region; and fifthly, the p-type semiconductor region preferably is in contact with the non-depleted p-type portion through which the injected electrons have to diffuse to reach the emitter tip surface for emission into free space.

The emitter tip is the body connected with the p-type semiconductor region which emits electrons when free electrons are available and when a sufficient first voltage is applied between the p-type semiconductor region and the facing extracting electrode. According to the invention, the emitter tip is made of a semiconductor material. Preferably, the semiconductor material is silicon. The emitter tip may be doped with p-type or n-type material depending on the desired electron emission behavior and other desired features of the field emission cathode. For example, the polarity of the doping type determines the charge polarity of the majority carrier of the emitter tip; if the emitter tip is p-type doped, the majority carriers are positive holes and only few electrons are free for electron emission and vice versa. Further, the doping level of the emitter tip determines the resistance of the emitter tip. Further, when the apex of the emitter tip is p-type doped the doping level determines the size of the depletion region. A low p-type doping level causes a large depletion region at the apex of the emitter tip when an external field is applied. A large depletion region in turn may contribute to a large leakage current which generates an emission current which cannot be controlled by the second voltage V2. Finally, the emitter tip preferably does not have an electric connection to regions of the field emission cathode other than-the one to the p-type semiconductor region. This is to exclude electron currents to the emitter tip which do not go through the p-type semiconductor region.

Preferably the emitter is an outwardly pointing body on the surface of the p-type semiconductor region. Preferably, the emitter tip has a form similar to a circular cone or needle pointing into free space with a sharp apex. In,order to generate the highest possible electric field strengths at a given voltage applied between p-type semiconductor region and a facing extracting electrode, the ratio between the length of the emitter tip to the radius of the apex is preferably maximized. Preferably, the apex radius of the emitter tip has a radius smaller than 200 nm and preferably smaller than 20 nm. Preferably, the ratio between emitter tip length and emitter apex radius is larger than 50 and preferably larger than 500. The length of an emitter is typically given by the distance between the apex to the base of the emitter tip, the latter usually being in plane with the main surface of a substrate.

While the emitter tip 9 is made of a semiconductor material, this does not exclude that there is a coating material on the emitter tip surface which is made of material other than a semiconductor, e.g. a metal or an insulator. Preferably, the thickness of the coating material layer is smaller than 100 nm and preferably smaller than 20 nm in order that electrons can tunnel through the metal layer for electron emission.

In one preferred embodiment the coating material on the emitter tip 9 is a layer of an insulator material Such insulator material e.g. may serve to passivate the emitter tip surface in order to reduce the leakage current. Again, preferably, the thickness of the insulator layer is smaller than 100 nm and preferably smaller than 20 nm in order that electrons can tunnel through the insulator layer for electron emission.

The first electric contact on the p-type semiconductor region provides an electric connection between the p-type semiconductor region with external voltage sources. The external voltage sources serve to provide a first voltage V1 between the emitter tip with respect to the extracting electrode and a second voltage V2 between the p-type portion of the pn-diode with respect to the n-type portion of the pn-diode.

Preferably, the first electric contact is an ohmic contact. An ohmic contact is an electric contact whose resistance is independent of the current direction. Preferably, the resistance of the ohmic contact is so small that it does not significantly change the potential of the connected region during the operation of the electron beam device. Typically, ohmic contacts on semiconductor material devices are realized by a metal-semiconductor layer structure where the semiconductor in the contact region is highly doped in order to reduce the resistance of the junction between metal and semiconductor. An ohmic contact allows the p-type semiconductor region to be adjusted to a well defined voltage by some external voltage source. In particular, with an ohmic connection the resistance between external voltage source and p-type semiconductor region is largely independent of the current direction.

The n-type semiconductor region is adjacent to the p-type semiconductor region to form the pn-diode junction with the p-type semiconductor region. Furthermore, a second electric contact is on the n-type semiconductor region, which preferably is an ohmic contact. Therefore, the electric potential of the n-type semiconductor region is defined by a voltage applied to the second electric contact. A second voltage V2 between the first electric contact on the p-type semiconductor region and the second electric contact on the n-type semiconductor region defines the voltage across the pn-diode. The second voltage V2 therefore also determines the electron current that the n-type semiconductor region injects into the p-type semiconductor region. The injected electron current in turn determines the electron current that the p-type semiconductor region can deliver to the emitter tip for electron emission into free space. Therefore, in order to provide a constant electron emission current, the second voltage V2 across the pn-diode junction preferably is well controlled.

Preferably, the second electric contact is an ohmic contact, too, which is independent of the direction of the current and which keeps the n-type semiconductor region at a well-defined potential during standard operation. A stable voltage for the p-type semiconductor region as well as for the n-type semiconductor region is extremely important in order to bias the pn-diode precisely in order to control the current injection into the p-type semiconductor region with high precision. The tight control of the current injection into the p-type semiconductor region enables a well-defined electron beam current.

Preferably, the emitter tip is made of p-type material. This way during operation, the non-depleted p-type portion of the emitter tip is in ohmic connection with the p-type semiconductor region. This implies that the voltage of the non-depleted p-type portion of the emitter tip is determined by the voltage of the p-type semiconductor region instead of by the external electric field generated by the extracting electrode. A constant voltage at the first electric contact therefore also provides a constant voltage at the non-depleted p-type portion of the emitter tip, i.e. it does not depend on changes of the external electric field at the emitter tip due to chemical states or shape of the emitter tip during operation. This is advantageous for electron beam devices where electric field interference into the electron beam region due to fluctuations of the emitter tip potential causes deterioration of the electron beam device performance.

In order that the injected electrons reach the emitter tip surface for electron emission they preferably have to travel through the non-depleted p-type portion of the p-type semiconductor region and possibly the non-depleted p-type portion of the emitter tip. The travel of electrons through the non-depleted p-type portion is critical since in this region the recombination rate of electrons with holes is high due to the abundantly available holes. Therefore, most electrons pass through the non-depleted p-type portion at a region where the distance through the non-depleted p-type portion is at a minimum. The percentage of electrons that succeed in passing through the non-depleted p-type portion therefore is characterized by the minimum non-depleted p-type distance D. To achieve a high electron transport efficiency it is advantageous to have the minimum non-depleted p-type distance D as short as possible.

The desire for a high electron transport efficiency is comparable to the desire to design a bipolar npn-transistor with a high current transport factor. The transport factor of a bipolar npn-transistor with a base contact, emitter contact and collector contact is given by the ratio of the collector currents to emitter current. There too, electrons are injected from the n-type emitter into a p-type base where the injected electrons recombine with holes or diffuse toward the collector. In order to transport a large fraction of the injected electrons from the p-type base to the n-type collector the thickness of the base should be much smaller than the diffusion length, $L_n$, of electrons in the p-type base. Otherwise many or the majority of injected electrons recombine in the p-type base with the abundantly available holes before they reach the collector.

The same holds true for the present invention where the minimum non-depleted p-type distance D(i.e. the "base layer thickness") is preferably shorter than the diffusion length, $L_n$, of electrons in the p-type semiconductor region. Preferably, the minimum non-depleted p-type distance D is even 10 times shorter than the diffusion length, $L_n$. This significantly reduces the loss of injected electrons due to recombination with holes, reduces electron emission noise fluctuations and reduces the current through the first electric contact, which increases the stability of the operation of the field emission cathode.

A high electron transport efficiency requires a long diffusion length, $L_n$. Thereby, the diffusion length, $L_n$, is known to be:

$$L_n = SQRT(kT \times \mu_n \times \tau_n / q)$$

where SQRT $(kT \times \mu_n \times \tau_n / q)$ is the square root of the bracketed expression where:

k is the Boltzmann constant,

T is the temperature of the semiconductor, $\mu_n$ is the electron mobility in p-type material, $\tau_n$ is the electron lifetime in p-type material, q is the electric charge.

The mobility, $\mu_n$, of electrons in the p-type material is related to the doping concentration of the semiconductor material: the lower the doping the higher the mobility, $\mu_n$. The electron lifetime, $\tau_n$, in non-depleted p-type material is directly related to the recombination rate of the electrons with holes. This parameter too is defined by the p-type semiconductor material. As can be seen from the formula, the diffusion length, $L_n$, depends heavily on,the choice of the material of the p-type semiconductor region. Therefore, by choosing the appropriate p-type semiconductor material of the p-type semiconductor region or emitter tip, the diffusion length, $L_n$, can be varied over a wide range. Typically, the diffusion length, $L_n$, of p-type material used for p-type emitter tips varies between a micrometer up to hundreds of micrometers.

In the model of the bipolar npn-transistor, the n-type semiconductor region corresponds to the emitter, the p-type semiconductor region to the base and the extracting electrode to the collector. Using the analogy, the electron beam device according to the invention preferably is operated in the "saturation mode" where both the pn-diode (emitter diode) and the extracting electrode (collector diode) are biased in a forward direction. The first voltage V1 between p-type semiconductor region and extracting electrode preferably is so high that the electron emission current depends only slightly or not at all on changes of the first voltage V1. In the saturation mode, the emission current therefore shows improved emission current stability even when the electric field at the emitter tip changes due to changes of shape or surface states of the emitter tip during operation. The present invention therefore overcomes the notorious problem of large emission current instabilities of field emission cathodes.

Preferably, the first voltage V1 between the extracting electrode and the first electric contact is provided. The size of the positive first voltage V1 depends on the geometry of the extracting electrode and the emitter tip. Among the most important parameters are the emitter tip height, H, from the base of the emitter tip to the apex of the emitter tip, the radius of the apex of the emitter tip, the length of the emitter tip and the material of the emitter tip. For an emitter tip made of silicon, the necessary field strength for significant electron emission is preferably above $10^9$ V/m. In this case the thickness of the potential barrier, T, through which electrons have to tunnel for electron emission is smaller than a few tens of nanometers. When the extracting electrode is positioned near the emitter tip as close as roughly 500 nm to 2 μm the positive first voltage may be as low as e.g. 20 to 200 V.

Preferably a forward biasing second voltage V2 across the pn-diode of the p-type semiconductor region and the n-type semiconductor region is provided. The second voltage V2 controls the pn-diode current, i.e. the electron current injected into the p-type semiconductor region. Preferably, the second voltage V2 is very stable to generate a stable electron emission current, since in the saturation mode, the injected electron current determines the electron emission current. For field emission cathodes made of silicon material, this second voltage is preferably in the range between −1 V to 1V, which is the range to switch the pn-diode on or off. For pn-diodes made of other semiconductor materials the voltages to switch on or switch off may be somewhat different.

Preferably, the field emission cathode is integrated with a semiconductor substrate. Preferably, the field emission cathode is integrated on a semiconductor substrate. The integration of a p-type semiconductor region with emitter tip and an n-type semiconductor region on a semiconductor is a well-known technique in the field of semiconductor microprocessing. It allows for an easy and cost-effective manufacturing of field emission cathodes with high geometrical precision. Preferably the semiconductor substrate is of the same material as the p-type semiconductor region and emitter tip. Preferably the semiconductor substrate is silicon because of the large availability of the material and the large diversity of processing techniques. However, the present invention also applies to all other semiconductor materials which can be p-doped and n-doped, have a sufficient diffusion length and can be structured in the required shape.

Preferably, also the extracting electrode is integrated onto the semiconductor substrate. By using microprocessing techniques for the integration of the extracting electrode onto the semiconductor substrate it is possible to position the extracting electrode as close as a micrometer or even a fraction of a micrometer to the emitter tip. This in turn allows extremely high electric fields at the emitter tip to be generated at a moderate first voltage value. Furthermore, the design of field emission cathodes with an integrated extracting electrode is more compact and more precise.

Preferably, the extracting electrode has an opening through which emitted electrons of the electron beam can pass to an anode. In this embodiment, the extracting electrode serves to extract electrons from the emitter tip while the anode serves to direct the emitted electrons towards some target. This way the electron emission rate control can be performed independently from the electron beam guidance control. The separation of the two procedures is important for electron beam devices like e.g. electron microscopes or electron beam pattern generators where the electron beam is to be directed in changing directions while the electron emission current value has to remain constant.

The design with an extracting electrode having an opening is strongly preferred for field emission cathodes with an integrated extracting electrode. There, the extracting electrode is so close to the emitter that the emitted electrons might not be of any use if they could not pass through a hole of the extracting electrode to an anode.

Preferably, the electron beam device comprises focussing components to direct and focus the beam. Focussing components may be magnetic lenses, deflection coils, anodes and other devices useful for electron beam deflection and beam focussing. For precision devices like electron microscopes and electron beam pattern generators it is important to adjust the electron emission current without changing the electrostatic fields in the electron beam region. Since in the saturation mode the electron emission current can be adjusted without changing the first voltage V1 between extracting electrode and emitter tip possible electric field interference due to a fluctuating extracting electrode potential into the electrical field of the electron beam optics cannot occur.

Preferably, the emitter tip is coated with coating material. The coating material may be on the emitter tip because of the manufacturing procedure or for better emitter tip stability. The coating material may also serve to reduce the leakage current due to surface generation centers at the surface of the emitter tip. The leakage current generates electrons which can be emitted without having traveled through the p-type semiconductor region. The leakage current therefore circumvents the electron emission control through the second voltage V2 across the pn-diode. Therefore, it is in the interest of good electron emission current control to minimize the leakage current.

In order to reduce the surface generation centers the coating material preferably is a passivation layer, e.g. silicon oxide for an emitter made of silicon. On the other hand, the layer of the coating material must be thin enough to not impede electron emission through a too high potential barrier thickness, T. For that reason, the thickness of the coating material at the apex of the emitter tip is preferably not thicker than tens of nanometers.

The invention according to claim 12 provides an electron beam device comprising an array of field emission cathodes with an array of extraction electrodes. An array of field emission cathodes allows an array of electron beams to be generated. Electron beam arrays are useful in many applications. For flat panel displays they are a precondition for generating a two-dimensional image on a screen. In applications like electron microscopy or electron beam pattern generators they allow for parallel inspection or parallel processing for improving e.g. the production throughput. However, these are only few of the many other applications for which arrays of field emission cathodes are useful.

Preferably the array of field emission cathodes is integrated onto a substrate, preferably a semiconductor substrate. The integration of arrays of field emission cathodes onto a substrate allows for the use of microprocessing manufacturing technology. With the use of microprocessing manufacturing technology arrays of field emission cathodes can be fabricated with high geometric and electronic precision, which helps to make the array of field emission cathodes homogeneous in functionality and positioning. Also, microprocessing manufacturing technology makes it possible to fabricate arrays with up to thousands or millions of field emission cathode on a silicon-size chip. The distance between neighboring field emission cathodes of such arrays may be in the range between millimeters down to less than one micrometer.

Preferably, the extracting electrodes of the array of extracting electrodes are electrically connected with each other. Preferably, they are connected with each other by low ohmic connections. Preferably, the extracting electrodes are at the same electric potential, which allows all extracting electrodes to be connected to only one external electric contact. This is a significant advantage compared to the situation where large arrays of extracting electrodes have to be connected individually. Thousands or even millions of conducting lines or contacts can be saved in this way. For many applications it is sufficient to connect the extracting electrodes of the array of extracting electrodes in such a way that the array of extracting electrodes is simply one conducting plate or one conducting layer.

It is one of the advantages of the present invention that in the saturation mode with the extracting electrodes at the same potential the electron beam currents can still be adjusted individually. In the saturation mode, the emission current depends only slightly or not at all on the first voltage V1. This implies that an array of many field emission cathodes, which to some degree all have individual geometric shapes, can be operated with the same first voltage V1 while still delivering a homogenous array of electron beams.

Preferably, also the n-type semiconductor regions of the array of field emission cathodes are electrically connected with each other. Preferably, the electrical connection is low-ohmic in order to have the n-type semiconductor regions at the same potential. This embodiment saves the many conducting lines that otherwise would be necessary to contact the n-type semiconductor regions individually. Preferably, the electrical connection is made by having the n-type semiconductor regions touch each other. Preferably, the n-type semiconductor regions touch each other in such a way that the many n-type semiconductor regions make up one n-type semiconductor region. In this embodiment, the structuring of the n-type semiconductor region on the substrate can be saved to reduce costs.

Preferably, the p-type semiconductor regions of the array of field emission cathodes are electrically connected with each other. Preferably, -the electrical connections are low-ohmic in order to have the p-type semiconductor regions at the same potential. This embodiment saves the many conducting lines that otherwise would be necessary to contact the p-type semiconductor regions individually. Preferably, the electrical connections are made by having the p-type semiconductor regions touch each other. Preferably the p-type semiconductor regions touch each other in such a way that the many p-type semiconductor regions make up one p-type semiconductor region. In this embodiment, the structuring of the p-type semiconductor region on the substrate can be saved to reduce costs.

It depends on the application which of the three electric connections, extracting electrode, p-type semiconductor region or n-type semiconductor region, should be common to all field emission cathodes of the array of field emission cathodes. If all three connections each are common to all field emission cathodes of the array of field emission cathodes, only two voltage sources are needed to bias an arbitrarily large array of field emission cathodes; however in this case the electron beam currents are not adjustable individually.

With the extracting electrodes of all field emission cathodes at a common potential and the p-type semiconductor regions of all field emission cathodes at a common potential, the n-type semiconductor regions are preferably connected to individual voltage supplies. In this case the electron beam currents can be adjusted individually by means of adjusting the second voltage V2, which for many applications is advantageous. Another advantage of this embodiment is that the electrical potential in the electron beam region is undisturbed when the electrical beam currents are adjusted, since a change of n-type semiconductor region potentials does not affect the external electric field of the region between emitter tips and extracting electrodes.

The method used to generate at least one electron beam current with the electron beam devices according to the invention comprises the steps of applying a positive first voltage V1 to the extracting electrode with respect to the p-type semiconductor region, and applying a second voltage V2 to the pn-diode junction formed by the p-type semiconductor region with the n-type semiconductor region.

Preferably, the second voltage V2 is a voltage forward biasing the pn-diode junction. In this case electrons from the n-type semiconductor region pass the pn-diode junction to enter into the p-type semiconductor region, from where they can travel to the apex of the emitter tip for electron emission into free space.

Preferably, the free space between emitter and extracting electrode is operated at a vacuum better than $10^{-6}$ mbar and preferably better than $10^{-9}$ mbar. A good vacuum value reduces the collision rate between the electron beam and residue gas which can destroy the electron beam on its way to its target. A good vacuum also impedes chemical reactions at the emitter tip which can deform the shape or surface state of the sharp tip. If too strong, such changes can deteriorate the operational lifetime of a field emission cathode.

The present invention however reduces the emission current instabilities due to bad vacuum, since in the saturation mode the electron beam current is less sensitive to variations of the electric field at the emitter tip. The vacuum may be generated each time that the electron beam device is put into operation, e.g. by a vacuum pump; however the vacuum may also be permanent, i.e. the volume between extracting electrode and emitter tip is evacuated once and sealed in a vacuum proof cartridge.

Preferably the positive first voltage V1 is increased to a level where the electron beam current has reached a saturation current value. Like the saturation region of a bipolar npn-transistor, a saturation current value of a field emission cathode is reached when the first voltage V1 is above the saturation threshold, i.e. above a voltage at which the current gain per voltage has decreased significantly.

The invention further provides a field emission cathode connected with an emitter tip made of p-type semiconductor material, whereby essentially all electrons entering the emitter tip flow through the p-type semiconductor region. The p-type semiconductor material of the emitter tip makes sure that there are only few or no free electrons available within the emitter tip (minority carriers). The fact that essentially all electrons entering the emitter tip flow through the p-type semiconductor region implies that there are no other pathways for electrons to flow to the emitter tip than by flowing through the p-type semiconductor region. This has the advantage that the electron current flowing to the emitter tip can be fully controlled by the second voltage V2 between the p-type semiconductor region and the n-type semiconductor region.

In another preferred embodiment of the invention, the pn-diode can be a tunnel diode. A tunnel diode is a diode with the p-type region and the n-type region so heavily doped that in thermal equilibrium the Fermi-level of the p-type material is within the energy region of the conducting band of the n-type region. This feature produces the well-known current-voltage curves of tunnel diodes with a region with negative differential resistance. With the second voltage V2 in the region with negative differential resistance, it is possible to control the electron beam device in such a way that an increase of the second voltage V2 reduces the electron emission current.

In another preferred embodiment of the invention, the pn-diode can be the collector diode of a bipolar pnp-transistor. In this case the p-type semiconductor region, the n-type semiconductor region and a second p-type semiconductor region form a bipolar pnp-transistor, where the p-type semiconductor region is the collector, the n-type semiconductor region the base and the second p-type semiconductor region the emitter. Preferably the electron current injected into the p-type semiconductor region is determined by the voltage between the emitter and the base. In this case the electron emission current can be controlled by the emitter-base voltage independent of the voltage of the p-type semiconductor region, provided that the first voltage V1 is in saturation.

BRIEF DESCRIPTION OF THE DRAWINGS

Some of the above indicated and other more detailed aspects of the invention will be described in the following description and partially illustrated with reference to the figures. Therein.

DESCRIPTION OF THE PREFERRED EMBODIMENTS

Figure 1A:
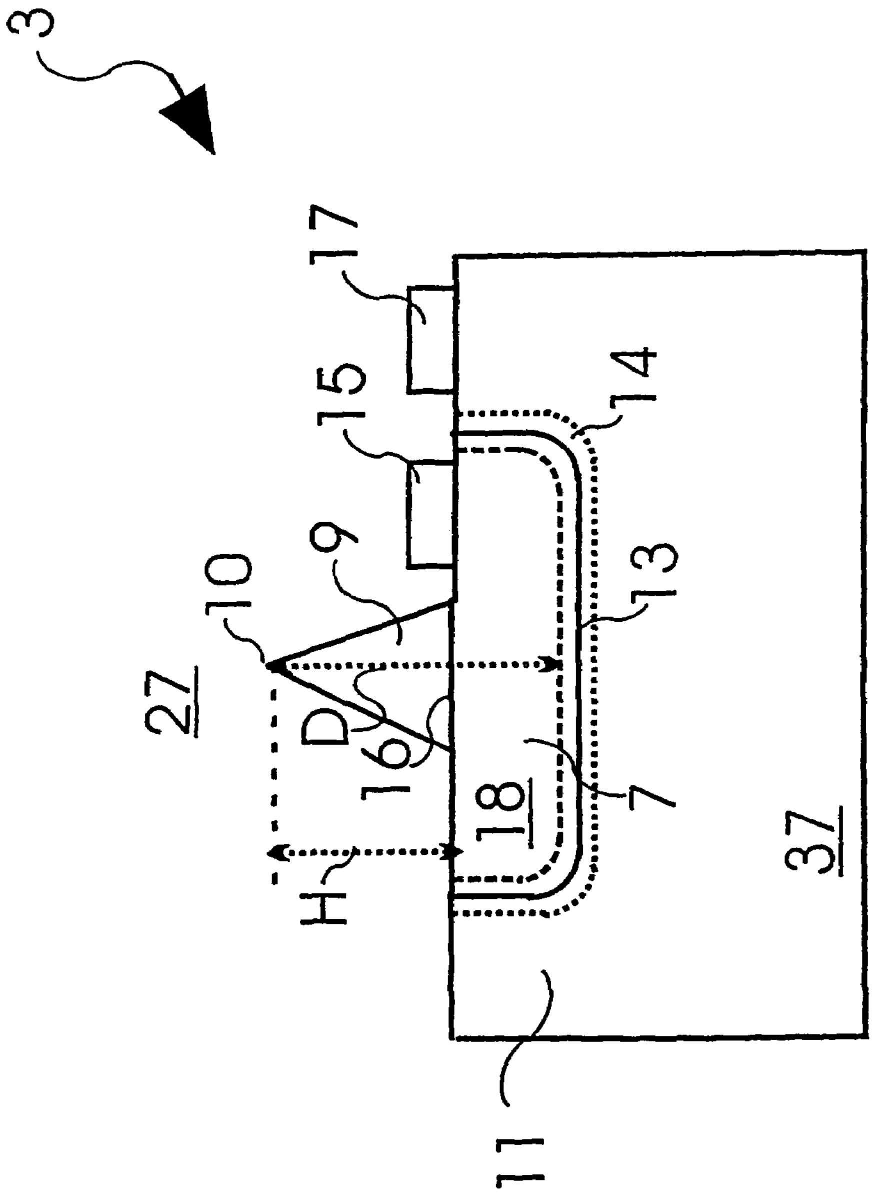
FIGS. 1*a-b* show schematically a first embodiment of a field emission cathode according to the invention with and without external electric field.
Figure 1B:
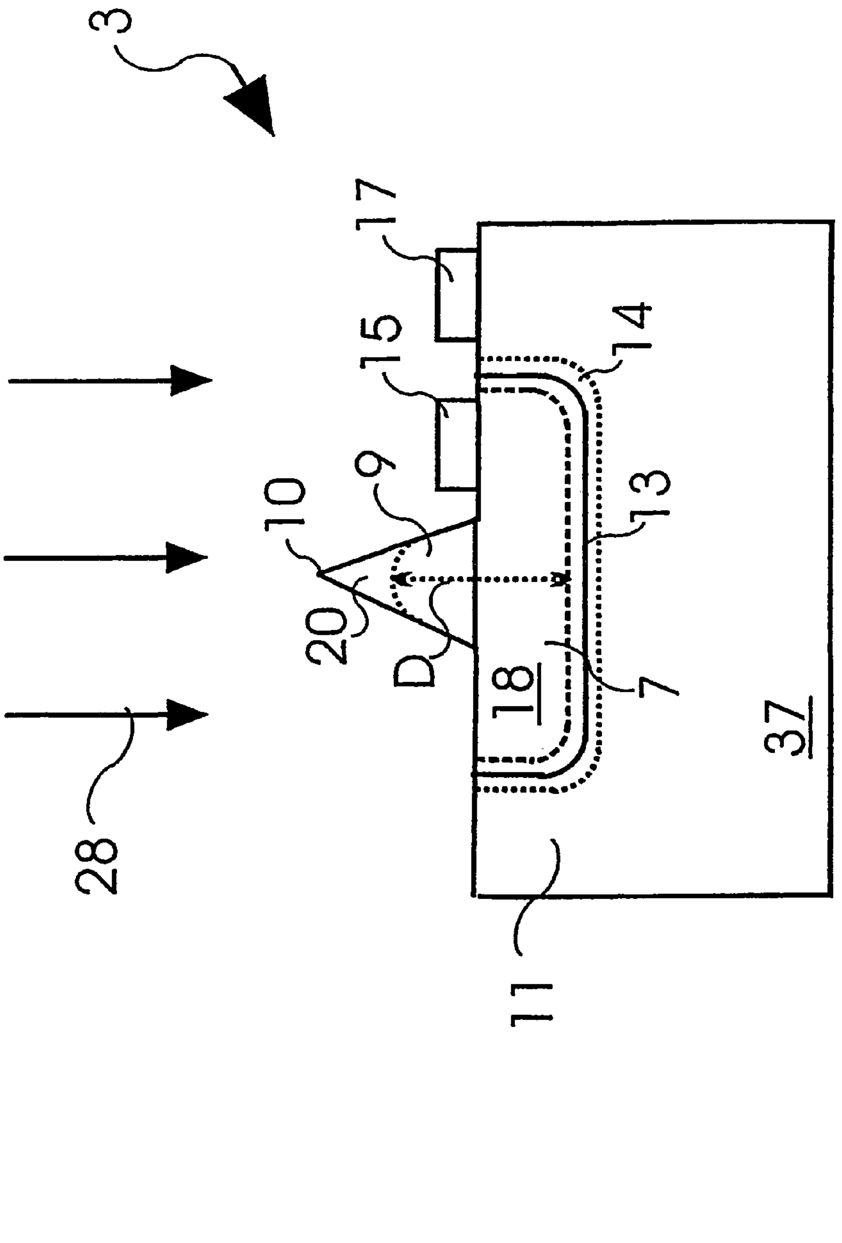
Figure 2A:
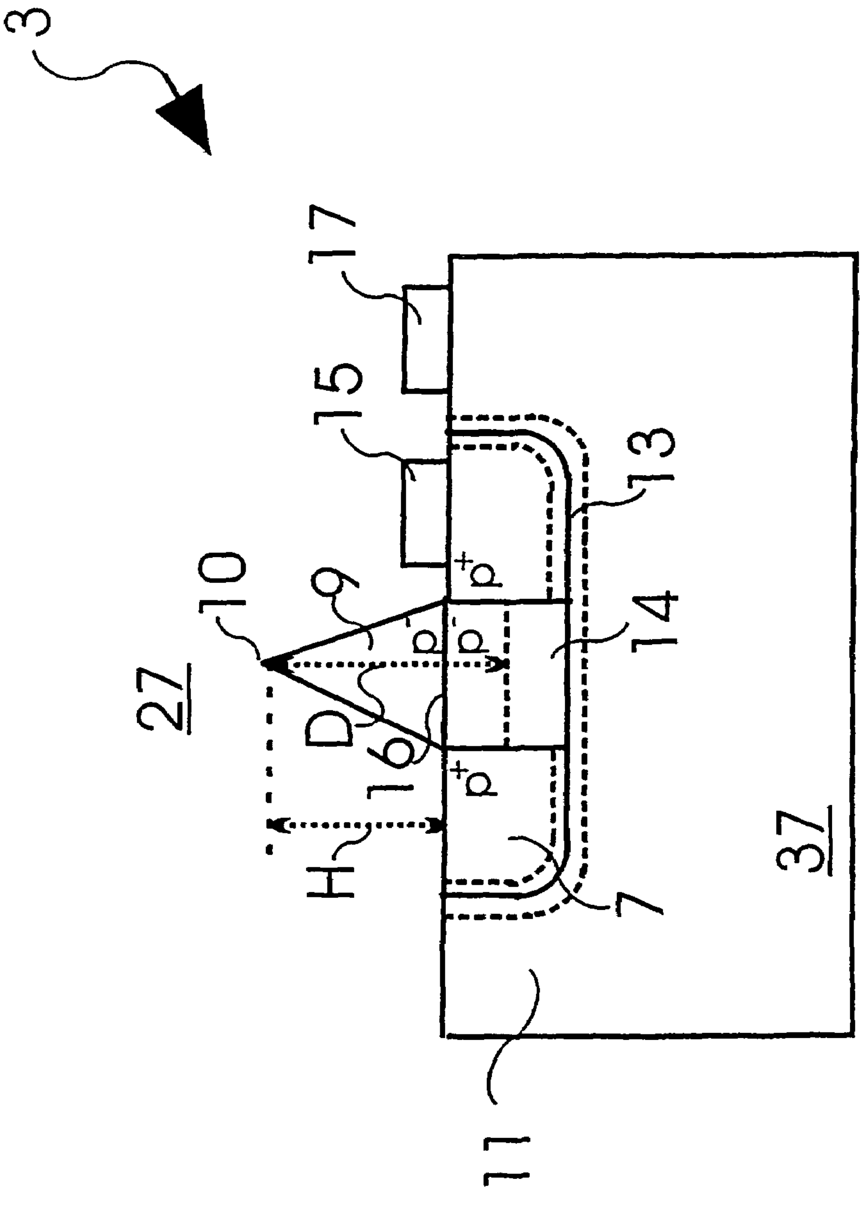
FIGS. 2*a-b* show schematically a second embodiment of a field emission cathode according to the invention with and without external electric field.
Figure 2B:
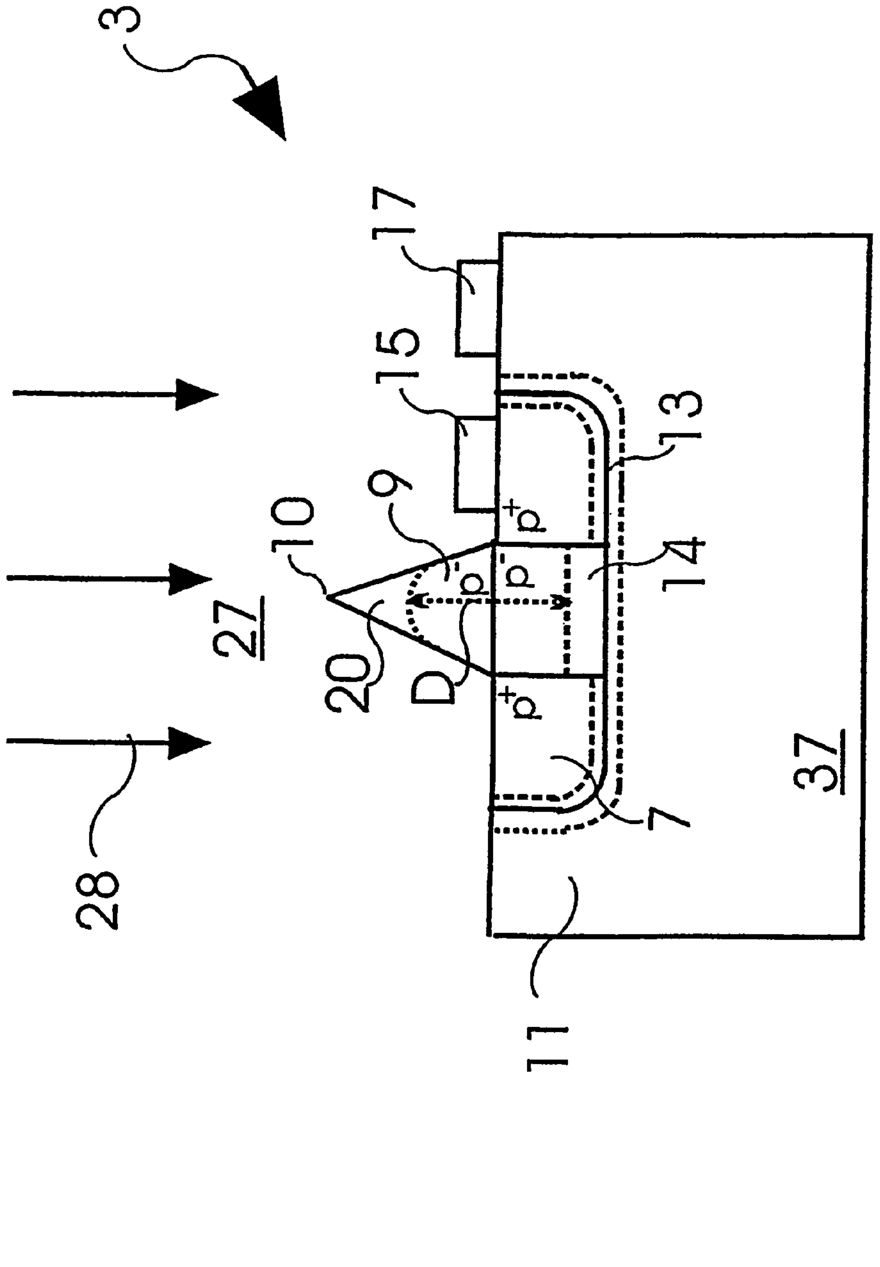
Figure 3A:
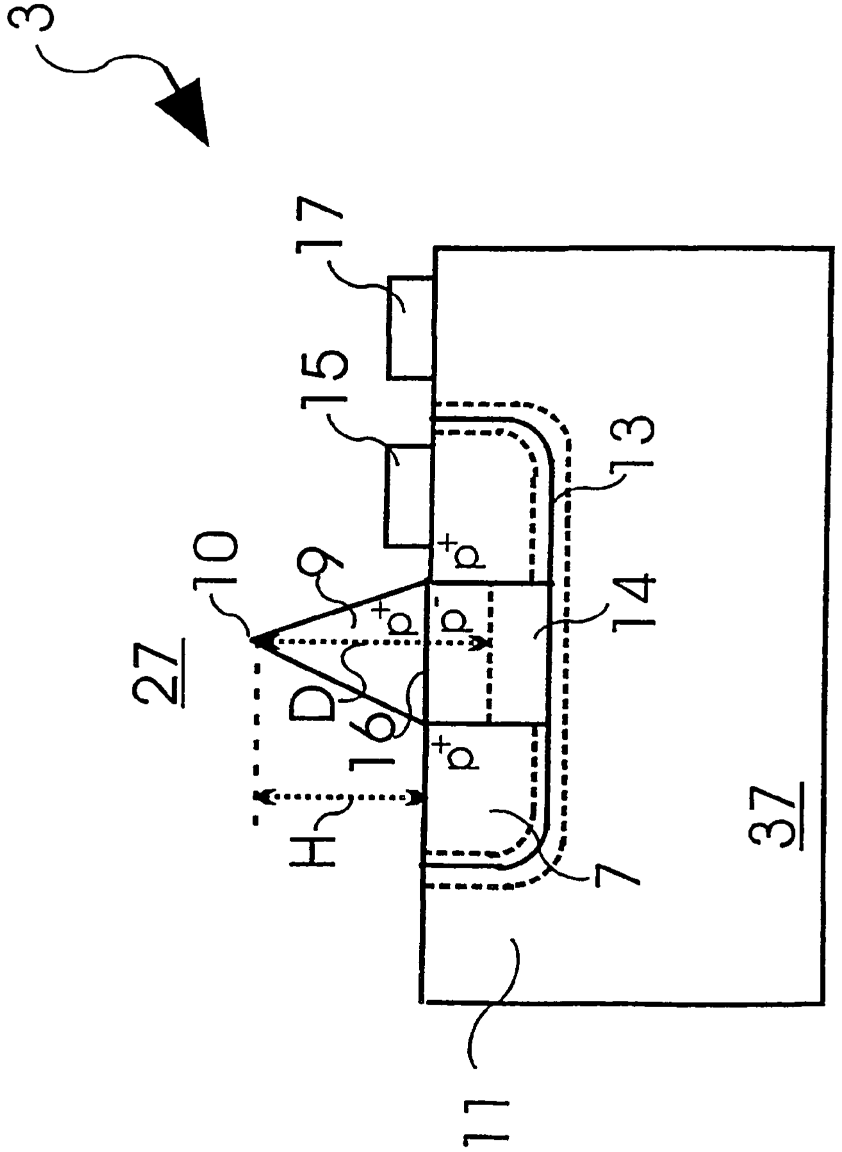
FIGS. 3*a-b* show schematically a third embodiment of a field emission cathode according to the invention with and without external electric field.
Figure 3B:
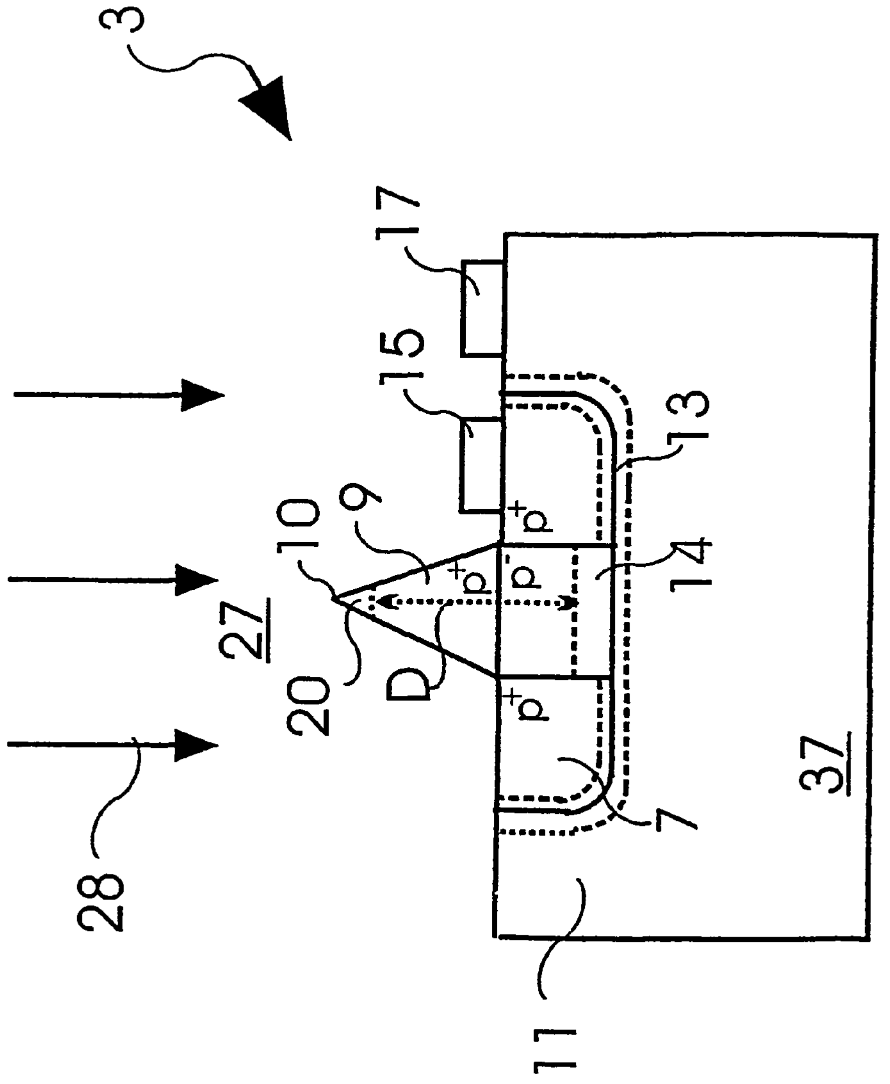

In FIGS. 1*a-b,* FIGS. 2*a-b,* FIGS. 3*a-b,* FIGS. 4*a-b* and FIGS. 5*a-b,* five embodiments of field emission cathodes according to the invention are shown schematically. FIGS. 1*a,* 2*a,* 3*a,* 4*a* and 5*a* refer to the embodiments without external electric field while FIGS. 1*b,* 2*b,* 3*b,* 4*b* and 5*b* refer to the same embodiments with an external electric field switched on. The figures with the external electric field switched on refer to the situation when the strength of the external electric field at the apex of the emitter tips is high enough that the field emission cathodes are operated in the saturation mode, i.e. in the mode where the electron emission current is limited by the electron injection into the p-type semiconductor region.

Preferably, the field emission cathodes of the preferred embodiments are made on a silicon substrate, because the process technology for generating the desired electrical and physical structure on silicon is well known. However substrates with other semiconductor materials would work as well.

In FIG. 1*a* the field emission cathode 3 without external electric field is shown. It comprises an n-type semiconductor region 11 with a p-type semiconductor region 7 forming a pn-diode junction 13 with a pn-diode depletion zone 14. The p-type semiconductor region 7 is further connected to an emitter tip 9 which points into fee space 27. The emitter tip 9 in FIGS. 1*a* and 1*b* is made of p-type doped semiconductor material. The non-depleted p-type portion of the emitter tip 9 and the non-depleted p-type portion of the p-type semiconductor region 7 therefore form one non-depleted p-type portion 18. Therefore the p-type semiconductor region 7 is in ohmic contact with the emitter tip 9, i.e. the potential of the emitter tip 9 is controlled by the voltage of the p-type semiconductor region 7.

The emitter tip 9 has a height H, which is the distance from the emitter tip base 16 to the apex of the emitter tip 10. The emitter tip base 16 is the line that separates the semiconductor substrate 37 from the emitter tip 9. The p-type semiconductor region 7 is connected to the emitter tip 9 in such a way that an electron current entering the emitter tip 9 must flow through the non-depleted p-type portion 18. Without external electric field, the minimum thickness that electrons have to travel through non-depleted p-type material, i.e. the minimum non-depleted p-type distance D reaches from the pn-diode junction 13 to the apex 10 of the emitter tip 9.

The p-type semiconductor region 7 further comprises a first electric contact 15 in order to be able to apply an external voltage to the p-type semiconductor region 7. Preferably the first electric contact 15 is an ohmic contact. Preferably, the first electric contact 15 comprises a conducting layer element that is connected to a conducting line making contact to a voltage source. In order to have a low contact resistance the p-type semiconductor region 7 is preferably highly doped in the region where the conducting layer element makes contact with the p-type semiconductor region 7. The vertical extension of the p-type semiconductor region 7 preferably is small to minimize the minimum non-depleted p-type distance D. Preferably, the vertical extension of the p-type semiconductor region 7 is below one micrometer.

The n-type semiconductor region 11 comprises a second electric contact 17 in order to be able to apply an external voltage to the n-type semiconductor region 11. Preferably the second electric contact 17 is an ohmic contact. Preferably, the second electric contact 17, too, comprises a conducting layer element that is connected to a conducting line making contact to a voltage source. In order to have a low contact resistance the n-type semiconductor region 11 is preferably highly doped in the region where the conducting layer element makes contact with the n-type semiconductor region 11.

There are several possibilities to manufacture a structure like in FIG. 1*a*. To give an example, an n-type semiconductor substrate may be selectively etched to form a sharp tip with an apex radius of a few nanometers and a length of a few micrometers. The sharp tip -serves as emitter tip 9 which emits electrons preferably at the apex. Methods to form such sharp tips with microprocessing techniques from a semiconductor material are known in the art. After forming the sharp tip, the r-type semiconductor substrate is selectively doped with p-type doping material in the region of the sharp tip to form the p-type semiconductor region 7 and the p-type emitter tip 9. The lateral extension of the p-type semiconductor region 7 preferably is large enough that the emitter tip base 16 is fully contained within the surface of the p-type semiconductor region 7, and that a first electric contact 15 can be applied to the p-type semiconductor region 7.

After generating the p-type semiconductor region 7 the first and second electric contacts, 15 and 17, are generated on the p-type semiconductor region 7 and n-type semiconductor region 11. Both electric contacts are preferably realized as ohmic contacts with a low resistance. The first electric contact 15 may consist e.g. of an aluminum layer element which is in contact with the p-type semiconductor region 7, whereby the p-type semiconductor region 7 is preferably highly p-doped in the region where the contact is made.

Analogously, the second electric contact 17 may consist e.g. of an aluminum layer element which is in contact with the n-type semiconductor region 11, whereby the n-type semiconductor region is preferably highly n-doped in the region where the contact is made. Details of making ohmic contacts on semiconductors are well-known in the art and are not further described.

FIG. 1*b* shows the same field emission cathode 3 like in FIG. 1*a*, however with a positive external electric field 28 switched on. With increasing external electric field strength leakage current generated in the emitter tip 9 increasingly gets emitted into free space 27. The region around the apex 10 of the emitter tip 9 therefore is increasingly depleted of free electrons and free holes to form a depleted p-type emitter region 20.

With an increasing depleted p-type emitter region 20 the minimum non-depleted p-type distance D becomes shorter. A shorter non-depleted p-type distance D in turn increases the electron transport efficiency through the non-depleted p-type portion 18. If the external electric field 28 at the surface of the emitter tip 9 is larger than $10^6$ V/cm the electrons arriving at the surface can be emitted into free space 27.

It is preferred to make the minimum non-depleted p-type distance D as short as possible. Preferably, the minimum non-depleted p-type distance D is shorter than the diffusion length, $L_n$, and preferably 10 times shorter than the diffusion length, $L_n$. To comply with this condition, the diffusion length $L_n$, is preferably chosen to be as long as possible. This can be achieved by having the p-type material lowly doped, by processing the p-type material in a way that it has only few recombination centers, or by increasing the temperature of the field emission cathode 3.

The size of the depleted p-type emitter region 20 might be smaller or even disappear when the leakage current generation in the emitter tip 9 is significant. If the leakage current generation is of the range or even larger than the electron emission current, the electrons may shield the emitter tip 9 from the external electric field 28, which in turn reduces the size of the depleted p-type emitter region 20. In order that the control of the electron emission current by the second voltage, V2, is not circumvented by leakage current generation, it is preferred to process the emitter tip in a way that the density of leakage current centers density in the emitter tip 9 is minimized.

In FIG. 2*a* another field emission cathode 3 without external electric field is shown. In FIG. 2*a* the doping levels within the p-type semiconductor region 7 are varied. The two $p^+$-type semiconductor regions are highly doped to provide a first electric contact 15 with low resistance to the p-type semiconductor region 7. The high doping levels also provide a low ohmic connection to the emitter tip 9 to keep the p-type region at a well defined electric potential. In this embodiment, the $p^+$-type semiconductor regions have a doping concentration preferably larger than $10^{16}$ 1/cm$^3$, preferably larger than $10^{18}$ 1/cm$^3$ and even more preferably larger than $10^{19}$ 1/cm$^3$.

The two $p^-$-type semiconductor regions in the p-type semiconductor region 7 and in the emitter tip 9 are lowly doped to provide a large diffusion length, $L_n$, in order to provide a large electron transport efficiency. A high electron transport efficiency allows for the operation of the field emission cathode 3 with a low pn-diode current injection at a given electron emission current. A low injection current reduces the noise fluctuations of the electron emission current, increases the stability of the field emission cathode operation and reduces heating. Heating might be an important issue for large arrays of field emission cathodes. The low $p^-$-type doping also reduces the minimum non-depleted p-type distance D since the pn-diode depletion zone 14 is extended. In this embodiment, the $p^-$-type semiconductor regions have a doping concentration preferably smaller than $10^{16}$ 1/cm$^3$, preferably smaller than $10^{15}$ 1/cm$^3$ and even more preferably smaller than $10^{14}$ 1/cm$^3$.

FIG. 2*b* shows the field emission cathode 3 like in FIG. 2*a* with the external electric field 28 switched on. Because of the low doping in the emitter tip 9, the depleted p-type emitter region 20 is larger than in FIG. 1*b*. This in turn reduces the minimum non-depleted p-type distance D to improve the electron transport efficiency.

At the same time, the highly doped $p^+$-regions of p-type semiconductor region 7 help to prevent the depleted p-type emitter region 20 from growing through the non-depleted p-type portion 18 to the point that the depleted p-type emitter region 20 touches the pn-diode depletion zone 14. In this case the minimum non-depleted p-type distance D would be zero. This can happen when the $p^-$-doping is very low, the external electric field 28 very high or the emitter tip height, H, very small. With the minimum non-depleted p-type distance D at zero, the electrons injected into the p-type semiconductor region could pass through the p-type semiconductor region without recombination. However, there would be no electron emission current control through the second voltage V2 anymore.

The field emission cathode 3 as shown in FIGS. 2*a* and *b* is preferably used for applications where a high electron emission current, e.g. larger than 10 nA, preferably larger than 100 nA is needed. In this case, a high transport efficiency is important. However, it comes as a disadvantage that the low doping level of the emitter tip 9 leads to a large volume of the depleted $p^-$-type emitter region 20 when the external electric field 28 is applied. The large volume of the depleted $p^{31}$ -type emitter region 20 causes a high leakage current which adds to the emission current. Since the leakage current cannot be controlled by the second voltage V2, it is preferred that the leakage current generated in the emitter tip 9 is at least an order of magnitude smaller than the electron current entering the pn-diode junction 13.

In addition, the low doping level of the p-type emitter tip 9 also leads to a larger resistance of the emitter tip. While a large emitter resistance can serve to stabilize the emission current in a self-regulating fashion, it can also be too high if a large emission current is desired for a given application.

FIGS. 3*a* and 3*b* show an embodiment of the invention like FIGS. 2*a* and 2*b* with the difference that the emitter tip 9 is a highly doped $p^+$-type region. The high p-type doping provides a reduced volume of the depleted p-type emitter region 20 when the external field 28 is switched on, compared to FIG. 2*b*. The smaller volume of the depleted p-type emitter region 20 in turn leads to a reduced leakage current. So that a large fraction of the emitted current can be controlled by the second voltage V2, it is important that the leakage current is significantly smaller than the total emission current. Therefore a high p-type doping of the emitter tip 9 is important when the total emission current of the field emission cathode 3 is small, i.e. smaller than 50 nA and preferably smaller than 10 nA. As a disadvantage, the high doping of the emitter tip 9 increases the minimum non-depleted p-type distance D, which in turn reduces the electron transport efficiency. Preferably, the $p^+$-type doping of the emitter tip is larger than $10^{16}$ 1/$cm^3$, preferably larger than $10^{18}$ 1/$cm^3$ and even more preferably larger than $10^{19}$ 1/$cm^3$.

Figure 4A:
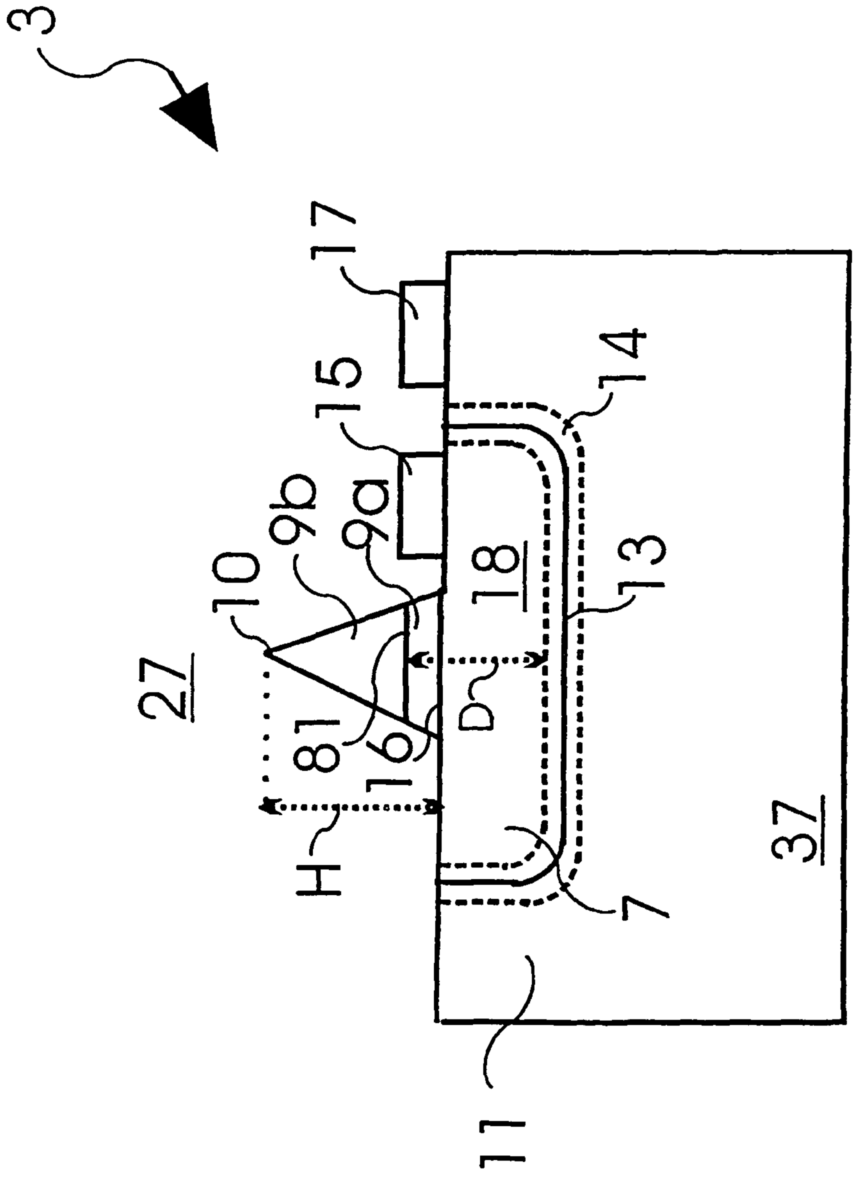
FIGS. 4*a-b* show schematically a fourth embodiment of a field emission cathode according to the invention with and without external electric field.

In FIG. 4*a* a fourth embodiment of a field emission cathode 3 without external electric field is shown, which differs from FIG. 1*a*, FIG. 2*a* or FIG. 3*a* in that the emitter tip 9 comprises two regions. The first emitter tip region is the emitter p-type region 9*a*, which is connected to the p-type semiconductor region 7. The second region is the emitter n-type region 9*b* which is not connected to the p-type semiconductor region 7 but comprises the apex 10 of the emitter tip 9. With this design the minimum non-depleted p-type distance D can be made much shorter than with an emitter tip 9 made of p-type material only, to increase the electron transport efficiency. However the upper part of the emitter tip 9, i.e. the emitter n-type region 9*b*, is not in ohmic connection with the p-type semiconductor region 7 because of the second pn-diode junction 81 between emitter p-type region 9*a* and emitter n-type region 9*b*. As a consequence the electric potential of the emitter n-type region 9*b* cannot be electrically controlled by a second voltage V2, i.e. the voltage between the first and second electric contact, 15 and 17. It also depends on the external field 28 at the surface of the emitter tip 9. This implies, that the energy of the electrons being emitted from the emitter tip 9 depends not only on the second voltage V2 but also on the first voltage V1. The second pn-diode junction depletion zone 80 due to the second pn-diode junction 81 is not shown in FIG. 4*a*.

Figure 4B:
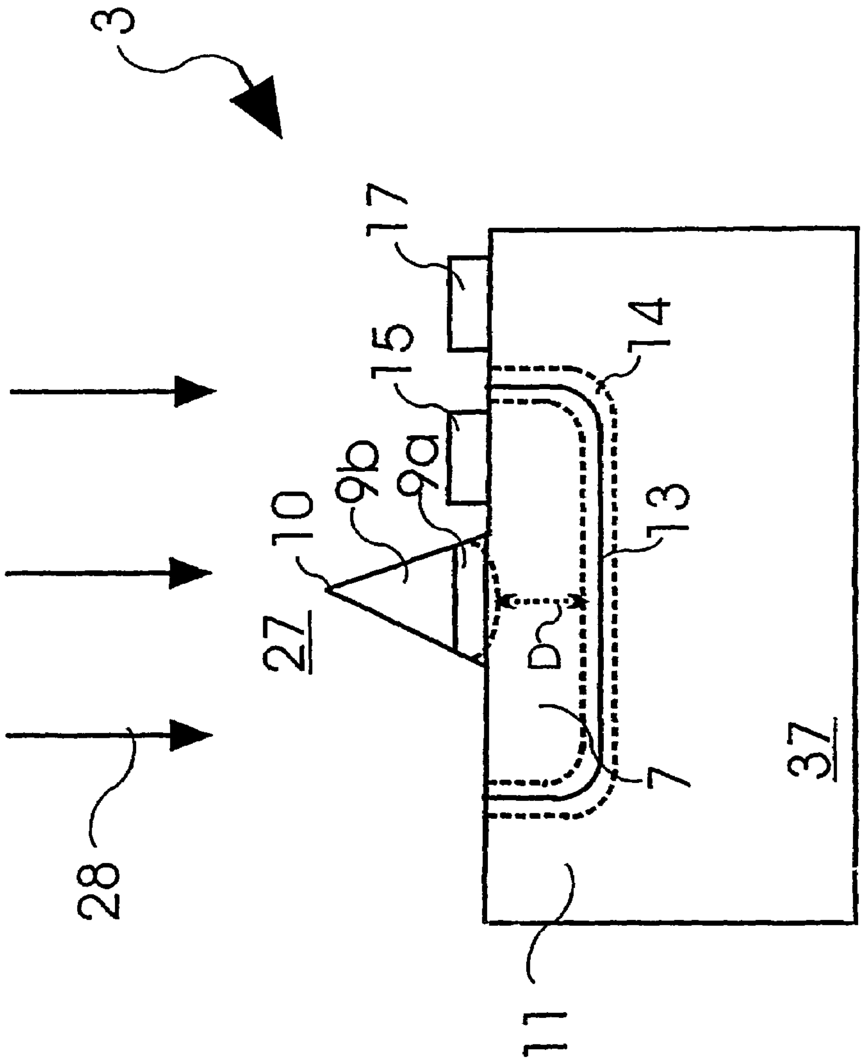

FIG. 4*b* shows the field emission cathode 3 of FIG. 4*a* with the external electric field 28 switched on. In this case the minimum non-depleted p-type distance D decreases due to the expanding second pn-diode junction depletion zone 80. In the saturation mode, i.e. when the potential barrier at the surface of the emitter tip is small enough that the electron emission current is determined by the electron injection into the p-type semiconductor region, the emitter n-type region 9*b* is fully depleted.

Figure 5A:
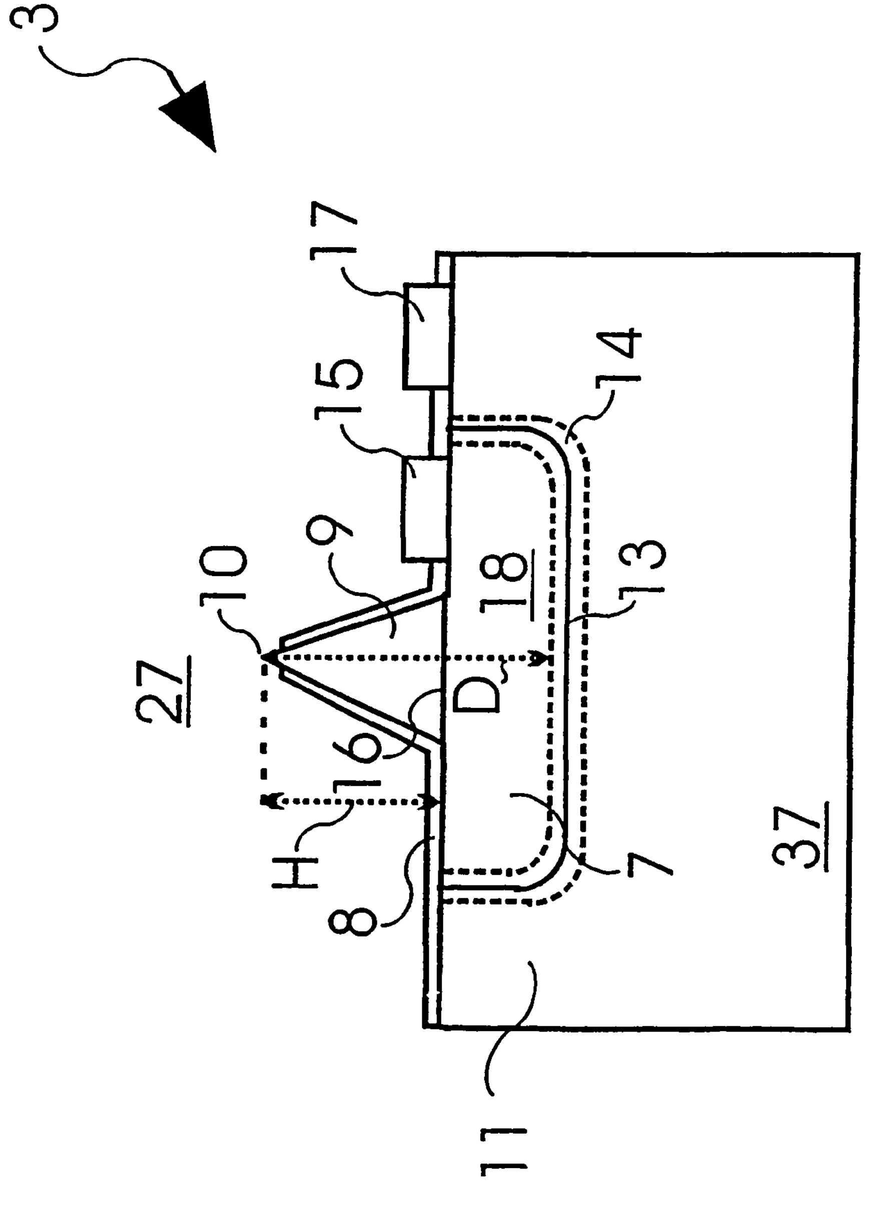
FIGS. 5*a-b* show schematically a fifth embodiment of a field emission cathode according to the invention with and without external electric field.

FIG. 5*a* shows a field emission cathode 3 like in FIG. 1*a* with the emitter tip 9 coated with a coating material 8. In one preferred embodiment the coating material 8 serves to reduce the density of leakage current generation centers at the surface of the emitter tip 9. A low leakage current is desirable for two reasons; firstly, the leakage current adds to the electron emission current but cannot be directly controlled by voltage across the pn-diode junction 13. In particular, the electron emission current cannot be switched off with the permanent leakage current on. Secondly, the external electric field strength at the emitter tip 9 which is necessary to generate an electron emission current independent of the strength of the external electric field 28 is higher (saturation mode). This is because the thickness of the potential barrier at the surface of the emitter tip 9 must be smaller in order that the electrons from the leakage current can tunnel through without significant delay.

If the emitter tip is made of silicon, the coating material is preferably made of silicon oxide. The layer thickness of the coating material 8 is low in order to not broaden the emitter tip 9 by too much. Preferably the layer thickness of the coating material 8 at the emitter tip 9 is below 100 nm and preferably below 10 nm in order to not diminish the external electric field in the region of the apex 10 of the emitter tip. Preferably, the apex 10 is not coated with coating material 8 in order to keep the potential barrier at the surface of the emitter tip 9 at the apex 10 small.

Figure 5B:
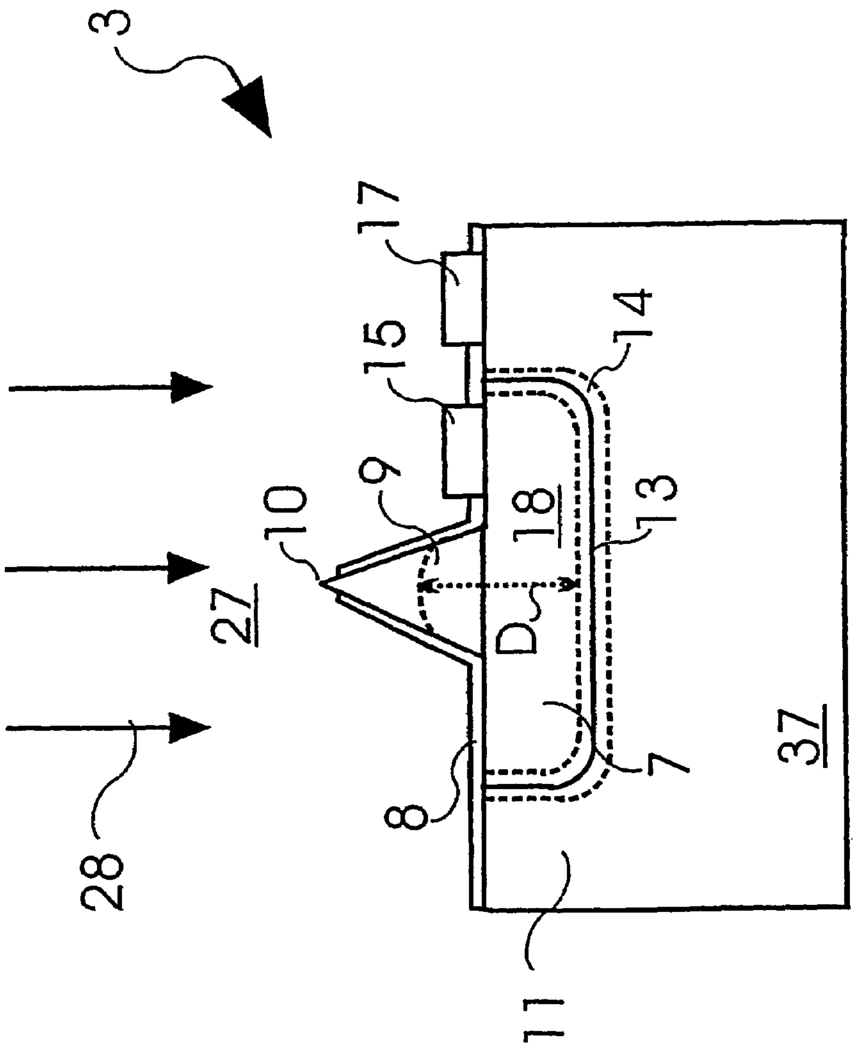

FIG. 5*b* shows the field emission cathode 3 of FIG. 5*a* with the external electric field 28 switched on. The coating material 8 on the emitter tip 9 keeps the leakage generation current small. Therefore, the external electric field 28 at the emitter tip 9 which is necessary to operate the field emission cathode 3 in the saturation mode is lower.

The embodiments of the invention as shown in FIG. 1*a* to FIG. 5*a* represent only a few examples of many other possible modifications of the invention. In particular, the doping profiles or the geometric layout of the emitter tip 9, the p-type semiconductor region 7 or the n-type semiconductor region 11 may be varied in many different features in order to optimize the device performance to a given application. However, from reading the disclosure, the modifications and variations will be apparent to persons skilled in the art. Such modifications and variations may also involve equivalent features and other features which are already known in the art and which may be used instead of or in addition to features already disclosed herein.

Figure 6A:
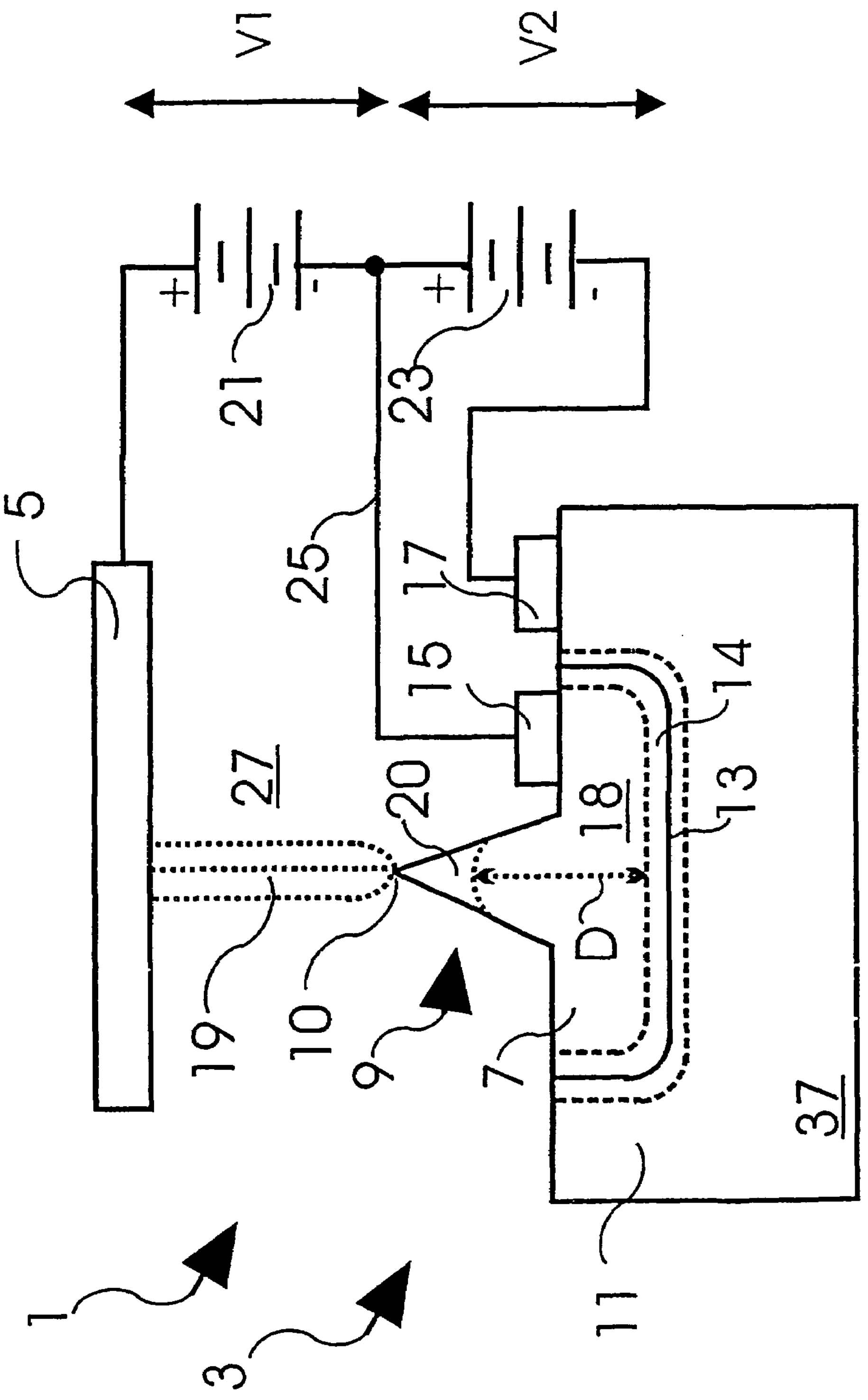
FIGS. 6*a-c* show schematically various embodiments of electron beam devices according to the invention with one field emission cathode and one extracting electrode.

FIG. 6*a* shows a first embodiment of an electron beam device 1 according to the invention. The electron beam device 1 comprises a field emission cathode 3 and one extracting electrode 5. The field emission cathode 3 can be any of those described in the description. The field emission cathode 3 shown in FIG. 6*a* equals the field emission cathode 3 shown in FIG. 1*a*. The field emission cathode 3 comprises a p-type semiconductor region 7 with an emitter tip 9 and an n-type semiconductor region 11. The n-type semiconductor region 11 and the p-type semiconductor region 7 together form the pn-diode junction 13. Furthermore, a first voltage source 21 is shown which is able to generate a positive first voltage V1 with respect to the p-type semiconductor region 7, and a second voltage source 23 is shown which is able to generate a forward biasing voltage V2 across the pn-diode junction 13.

By applying a sufficiently large first voltage V1 between the extracting electrode 5 and the p-type semiconductor region 7, a high external electric field 28 is generated at the emitter tip 9. The maximum field strength of the external electric field is generated at the apex 10 of the emitter tip 9. Accordingly, free electrons are preferably emitted at the apex 10 of the emitter tip 9. If the first voltage V1 is high enough that the potential barrier at the surface of the emitter tip 9 is thin enough that all electrons reaching the apex 10 of the emitter tip 9 can tunnel through without delay, the external electric field penetrates into the emitter tip region forming the depleted p-type emitter region 20. The electron beam device 1 is then said to operate in the saturation mode.

The extracting electrode 5 serves to apply a high electric field to the emitter tip 9, and in particular to the apex 10 of the emitter tip 9. The minimum field necessary to emit electrons in the range of nanoamperes from the emitter tip 9 is about $10^8$ V/m to $10^9$ V/m. To achieve such high electric fields at the apex 10 of the emitter tip 9 at reasonable voltages, the apex radius has to be very small (e.g. in the nanometer scale) and the ratio of the length of the emitter tip to the apex radius rather large (a few hundreds). With the extracting electrode 5 as close as about a micrometer to the emitter tip apex 10 it is possible to achieve significant emission beam currents with voltages as low as 20 to 100 V. If higher voltages V1 are allowed between emitter tip 9 and extracting electrode 5 then of course the extracting electrode 5 can be positioned further away from the emitter tip. The first voltage V1 between the extracting electrode 5 and the first electric contact 15 is supplied by the first voltage source 21.

The second voltage source V2 provides the voltage between the first electric contact 15 and the second electric contact 17, which in turn supplies the voltage to operate the pn-diode consisting of the p-type semiconductor region 7 and the n-type semiconductor region 11. When the voltage at the n-type semiconductor region 11 is more positive than the voltage at the p-type semiconductor region 7, the pn-diode is biased in a forward direction. This implies that electrons from the n-type semiconductor region 11 cross the pn-diode junction 13 into the non-depleted p-type portion 18 where they travel randomly around until they either reach the depleted p-type emitter region 20, the surface of the apex 10 or they recombine with the abundantly available holes in the p-type semiconductor region 7. Preferably, the electron emission current 19 is controlled through second voltage V2 by keeping first voltage V1 constant. This way, the electric field in free space 27 is not affected by switching or changing the electron emission current 19.

Those electrons which reach the depleted p-type emitter region 20 see the external electric field generated by the extracting electrode 5, and drift towards the apex 10 of the emitter tip 9. At the surface of the apex 10 the potential barrier is preferably so thin that the electrons can tunnel through it. Once emitted from the surface of the emitter tip into free space 27 the electrons drift to the extracting electrode 5. Since the free space 27 between emitter tip 9 and extracting electrode 5 is preferably evacuated the electrons drift to the extracting electrode 5 with few or no collisions with residual gas atoms or molecules.

The conducting lines shown in FIG. 6*a* may be simple cables, but they may also be conducting lines printed on a circuit board or structured on a substrate.

Figure 6B:
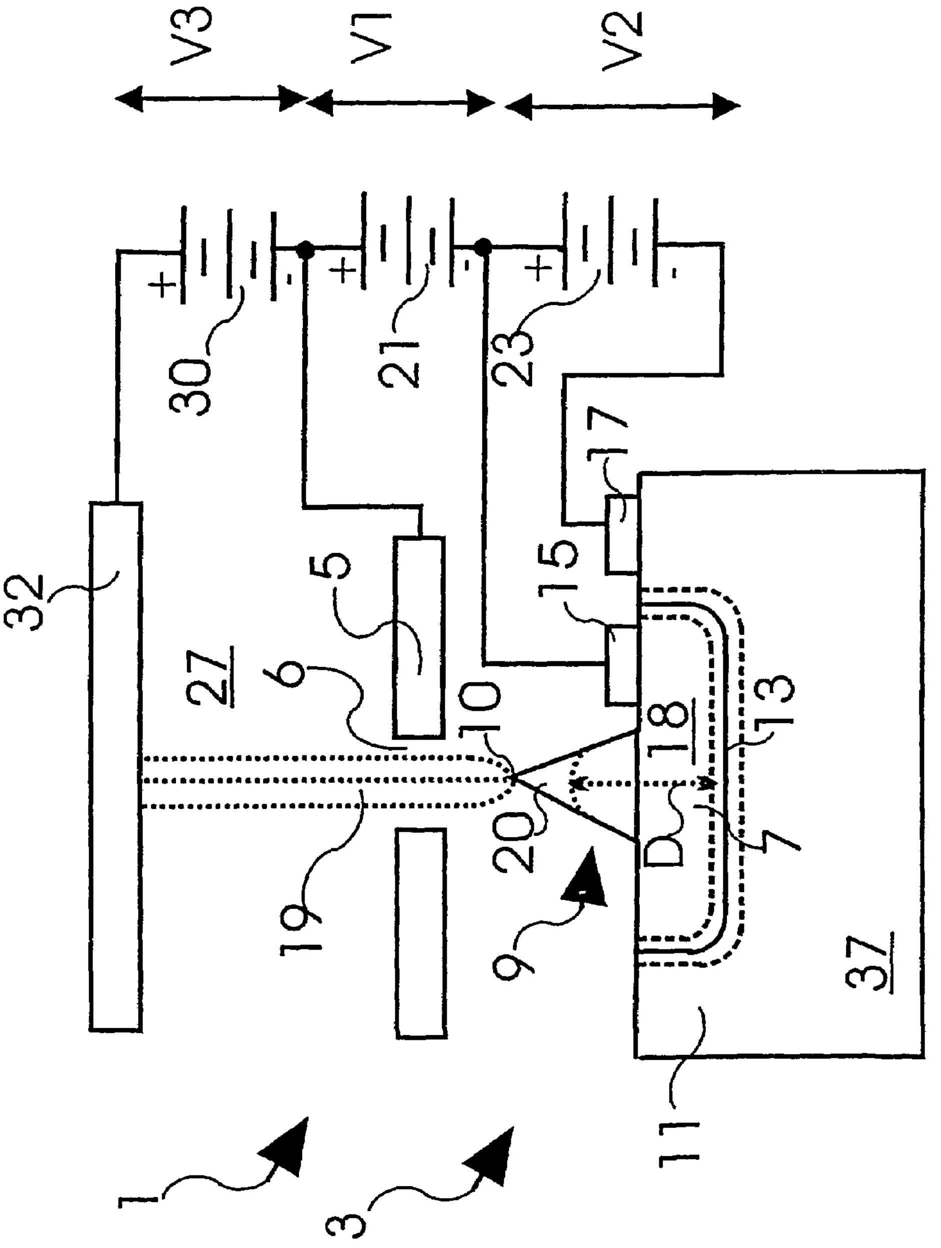

In FIG. 6*b* an electron beam device 1 is shown with a field emission cathode 3 identical to the one shown in FIG. 1*b;* however the extracting electrode 5 is different in that the extracting electrode 5 has an opening 6 through which the electron beam 19 can pass when another anode 32 is there to attract the electrons. In FIG. 6*b* the anode is at a voltage given by the third voltage source 30 which preferably makes the potential of the anode more positive than the potential of the extracting electrode 5. The opening 6 in the extracting electrode 5 has the advantage that the extracting electrode 5 can be positioned very closely to the emitter tip while the electron beam 19 can still go some distance to perform functions like. e.g. scanning a specimen for an electron microscope, scanning a wafer surface on an electron beam pattern generator or exciting light emission on a phosphorus screen. Further, the extracting electrode 5 can be positioned as close as a few micrometers or even closer to the emitter tip 9. For such a design, it is possible to integrate the extracting electrode 5 by using microprocessing techniques, which allows for a compact and cost effective manufacturing. In addition, such a close distance between extracting electrode 5 and emitter tip 9 makes it possible to achieve a sufficient electric field strength for electron emission at the emitter tip 9 at a moderate first voltage V1, e.g. below 100 V. The use of low voltages eliminates the many known problems that arise with the use of high voltages like e.g. above 1 kV or above 10 kV.

Figure 6C:
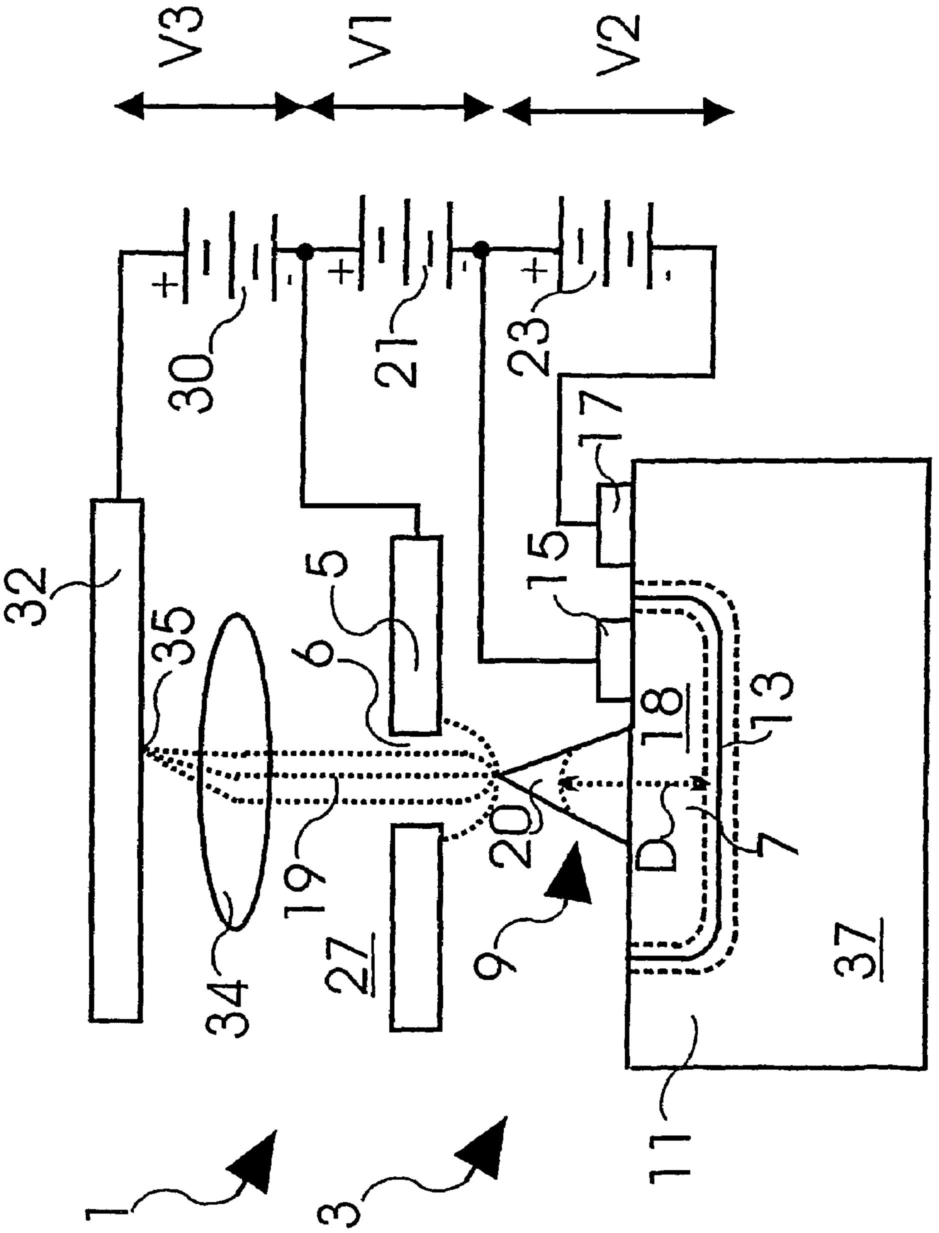

In FIG. 6*c* an electron beam device 1 like in FIG. 6*b* is shown. The only difference is the introduction of focussing components 34 into the path of the electron beam 19. The focussing components 34 in FIG. 6*c* represent any electric or magnetic device or a combination of those devices which focus or direct the electron beam 19 to a position. Focussing components 34 are used e.g. for electron microscopes or electron beam pattern generators. The electron beam device 1 as shown in FIG. 6*c* offers high stability of the electron beam current since the emission current is preferably controlled by the pn-diode current which is controlled by the second voltage V2. In addition, even when an adjustment of the electron beam current value is necessary, the correction is preferably done by adjusting the second voltage V2 across the pn-diode junction 13, which usually only has to be changed by less than a volt. Such a change is hardly sensed by the focussing components 34. As a result, with a device as shown in FIG. 6*c* it is possible to control the electron beam current without significant interference with electrical or magnetic fields determining the path of the electron beam 19. This is a major advantage over electron beam devices where the emitter current value is controlled by the voltage between the emitter tip and the extracting electrode. Those voltages tend to interfere with the electric field that controls the path of the electron beam.

Figure 7A:
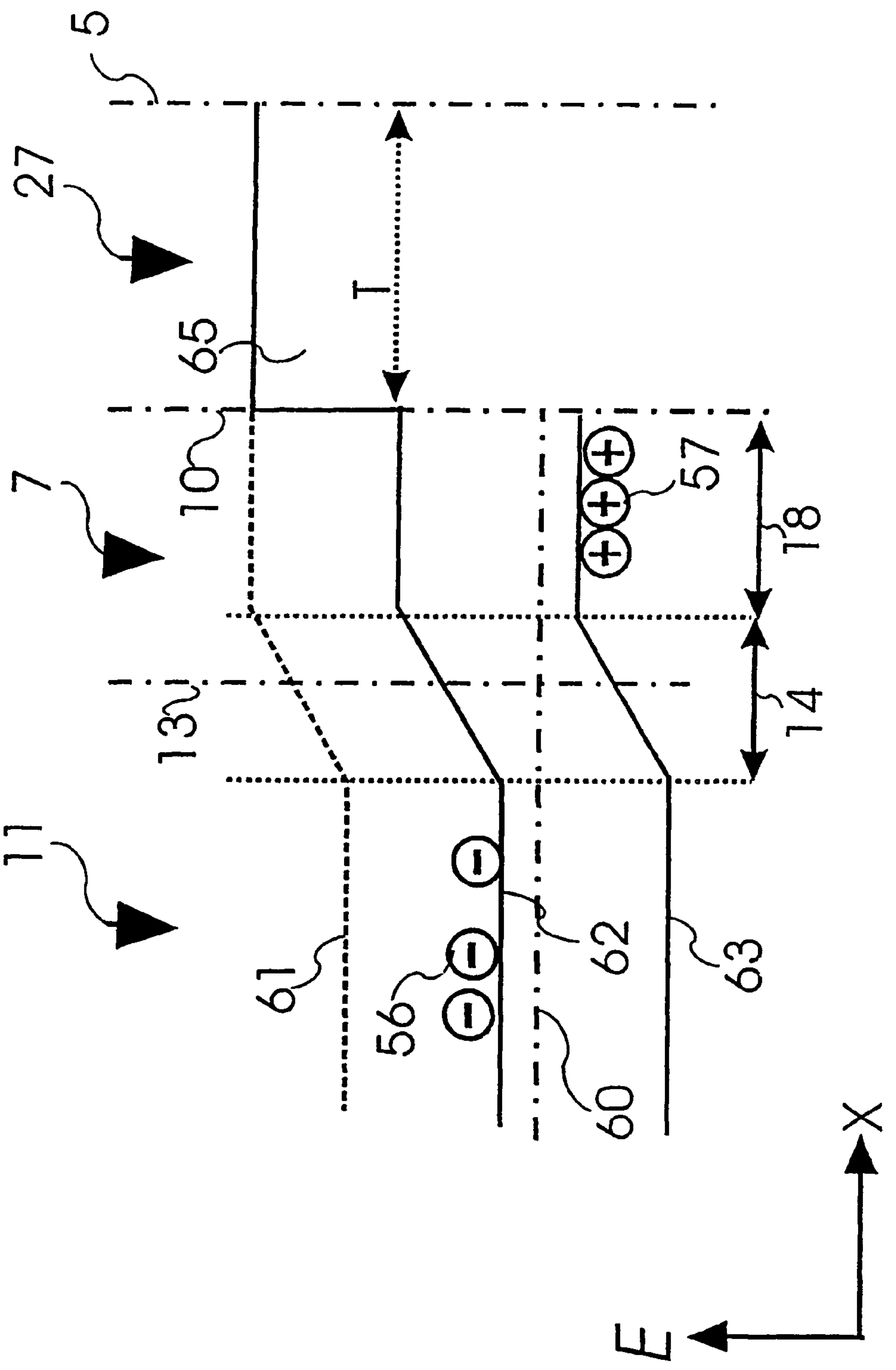
FIGS. 7*a-c* show schematically a method to generate an electron beam with an electron beam device according to the invention, whereby the emitter tip is p-type material.
Figure 7B:
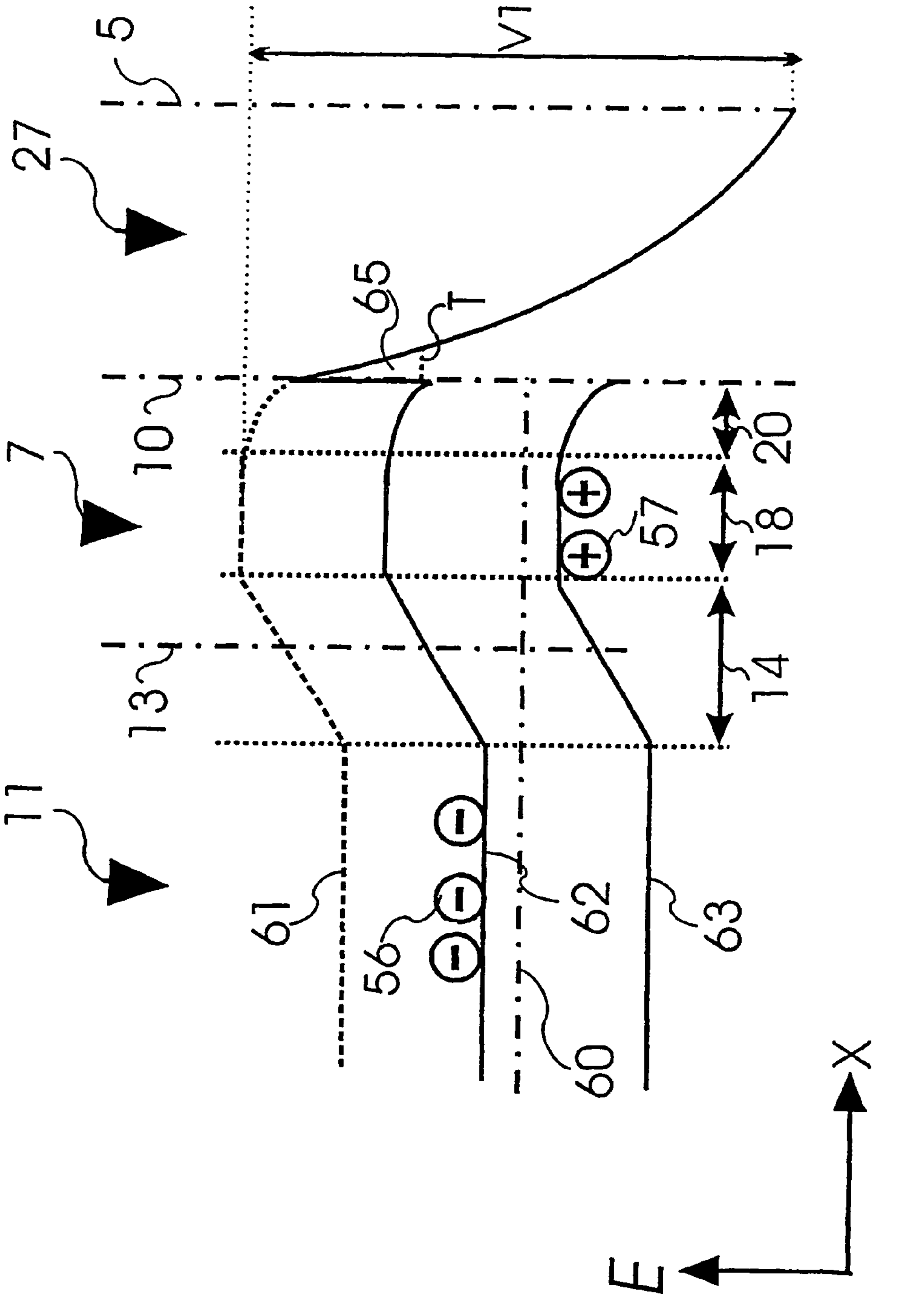
Figure 7C:
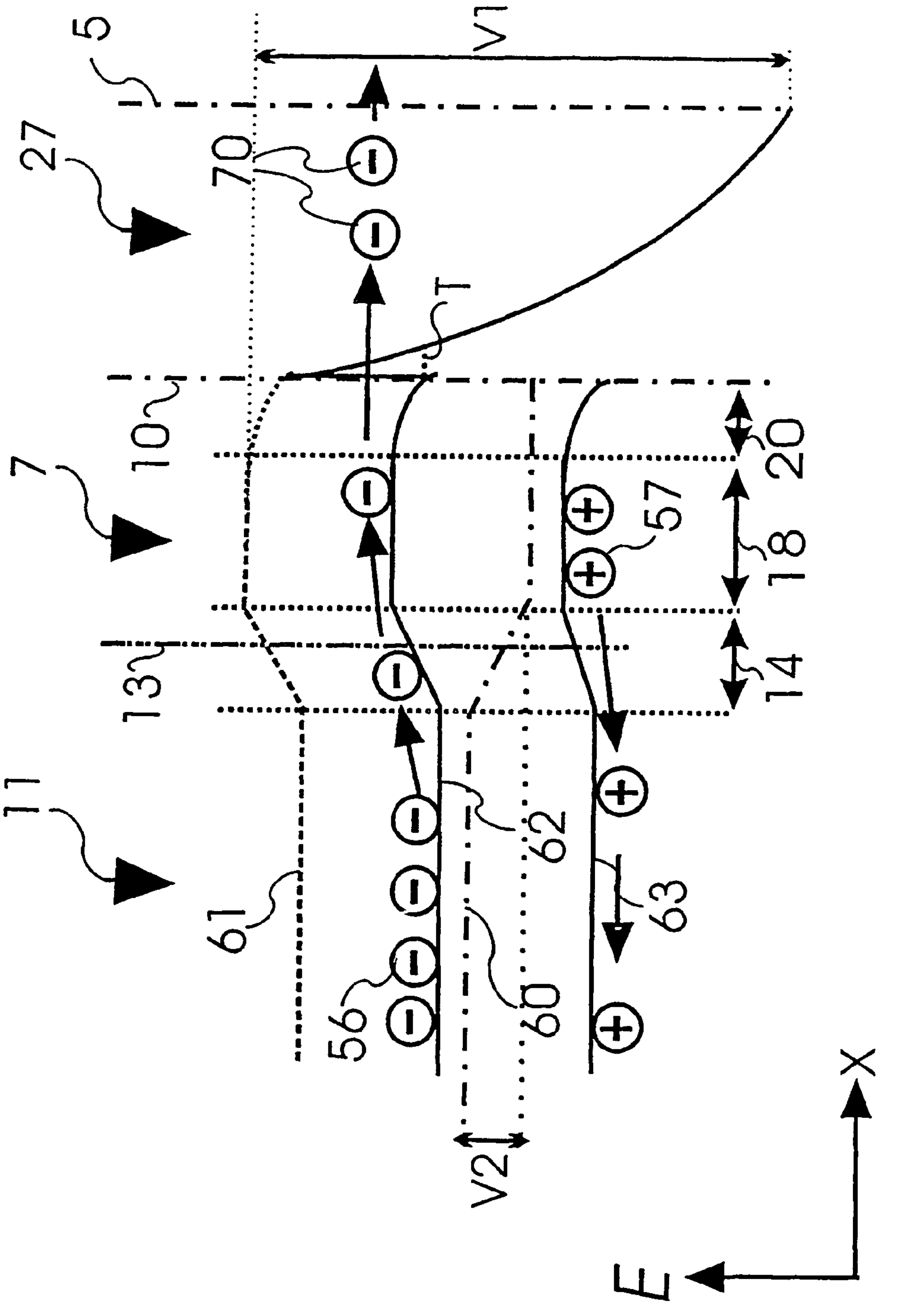

In FIG. 7*a* to 7*c* position-energy plots are shown which schematically illustrate the underlying physical model as they are thought to be valid for the electron emission of electron beam devices, using field emission cathodes like in FIG. 1*a*. The physical model shown in FIG. 7*a* to 7*c* serves as an attempt to explain the invention, however FIG. 7*a* to 7*c* are not meant to describe the devices according to the invention to the full extent.

The horizontal axis X represents the positions along the axis of an emitter tip 9 from the n-type semiconductor region 11 to the apex of the emitter tip 10 further to the extracting electrode 5. The vertical direction meanwhile represents the electron energy levels with the Fermi-energy 60, of the lower edge of the conducting band 62, of the upper edge of the valence band 63 and the vacuum energy level 61 that together define the emission current of the electron beam device according to the invention.

On the left side of the position-energy plot there is the n-type semiconductor region 11 which reaches to the pn-diode junction 13. In the n-type semiconductor region 11 the majority carriers are electrons as indicated by the free electrons 56, drawn on the upper edge of the conducting band line 62. Following the pn-diode junction 13, there is the p-type semiconductor region 7 which reaches to the position of the apex 10 of the emitter tip 9. In the p-type semiconductor region 7 the majority carriers are holes, as indicated by the free holes 57 drawn below the upper edge of the valence band line 63. To the right of the apex position 10 there is free space 27, which preferably is at a good vacuum, which reaches to the extracting electrode 5. Between apex 10 and extracting electrode 5 is the potential barrier 65 with the potential barrier thickness T and a height given by the vacuum energy level 61.

The lower edge of the conducting band line 62 indicates the energy sector where free electrons 56 are allowed to move. Electrons are free electrons when they are above the lower edge of the conducting band line 62. Without external forces, free electrons 56 tend to move to the position with the lowest value of the lower edge of the conducting band line 62. This is why there is an abundance of free electrons 56 in the n-type semiconductor region 11 outside the pn-diode depletion zone 14. This region therefore is called non-depleted n-type semiconductor region.

The same holds true for holes except for the polarity. The upper edge of the valence band line 63 indicates the energy sector where holes 57 are allowed to move. Without external forces holes 57 tend to move to the position with the highest value of the upper edge of the valence band line 63. This is why there is an abundance of holes 57 in the p-type semiconductor region 7 outside the pn-diode depletion zone 14. This region therefore is called non-depleted p-type semiconductor region.

Finally, the letter $E_g$ indicates the gap energy between the upper edge of the valence band line 63 and the lower edge of the conducting band 62. The region between the two bands is called the forbidden band, since in this energy section no electrons or holes are allowed to reside. The gap energy is a constant depending on the semiconductor material. For silicon, the gap energy, $E_g$, is ca. 1.1 eV at room temperature.

The sequence of FIG. 7*a* to 7*c* schematically shows an example of the method to provide an electron beam 19 according to the invention. In FIG. 7*a*, no external voltages are applied, i.e. the first voltage V1 and the second voltage V2 are zero. Consequently, the Fermi-energy level 60 is at a constant energy. The lower edge of the conducting band 62 and the upper edge of the valence band 63 arrange themselves around the Fermi-energy level 60 according to their doping levels: for the n-type semiconductor region 11 the Fermi-energy level 60 is closer to the conducting band 62 while in the p-type semiconductor region 7 the Fermi-energy level 60 is closer to the valence band 63.

In the transition region around the pn-diode junction 13, conducting band 62 and valence band 63 are bent in order to have a continuous connection between the left half of the conducting band (or valence band) and the right half of the conducting band (or valence band). The bent conducting band line 62 represents a potential barrier which prevents the electrons from moving into the p-type semiconductor region 7 while the bent valence band line 63 represents a potential barrier which prevents the oppositely charged holes from moving into the n-type semiconductor region 11. The region where conducting band 62 and valence band 63 deviate from a horizontal line is depleted of free electrons, forming the pn-diode depletion zone 14.

The height of the potential barrier 65 with respect to the conducting band 62 represents the energy that an electron needs in order to be able to escape into free space, which preferably is a vacuum. The height of the potential barrier depends on the semiconductor material and the doping level. Without externally applied voltage, i.e. at thermal equilibrium, the potential barrier 65 reaches from the apex 10 of the emitter tip 9 to the extracting electrode 5. This is usually a macroscopic distance which is too thick for electrons to tunnel through.

FIG. 7*b* shows the same position-energy plot as in FIG. 7*a* with the difference that an external first voltage V1 is applied between the p-type semiconductor region 7 and an extraction electrode 5, which is positive with respect to the p-type semiconductor region 7. The first voltage V1 generates an electric field in free space 27 which causes the potential barrier 65 to bend downwards. While bending the potential barrier 65 downwards the potential barrier 65 takes on a shape with decreasing potential barrier thickness, T.

When first voltage V1 is applied the external electric field moves free holes 57 away from the apex region 10, if no electrons are generated within the p-type semiconductor region 7 to shield the p-type semiconductor region 7 from the external field. In this case the external electric field depletes the region around the apex 10 of the emitter tip 9 to form the depleted p-type emitter region 20. As a consequence, the non-depleted p-type portion with the free holes 57 becomes thinner and the minimum non-depleted p-type distance D shrinks.

When the first voltage V1 has been increased to the level where the electric fields strength at the apex 10 of the emitter tip 9 is larger than $10^8$ V/m to $10^9$ V/m the potential barrier thickness, T, is so small that free electrons could tunnel through. However with only the first voltage V1 on, there may be no free electrons near apex 10 of the emitter tip 9.

The only free electrons that might be available for electron emission are electrons that have been generated within the non-depleted p-type portion 18 or within the depleted p-type emitter region 20, i.e. the leakage current. When it is desired that the second voltage V2 have full control over the electron emission current, the leakage current should be small, since it cannot be controlled by the second voltage V2. If is allowed to control the electron emission current by both, the first and second voltages V1 and V2, the first voltage V1 can also be used to control also the leakage current. However a change of the first voltage V1 might cause electrostatic interference with the electron beam optics of some sorts of electron beam devices.

In FIG. 7*c* the same plot as in FIG. 7*b* is shown with the difference that in addition to the first voltage V1 the second voltage V2 has been raised from zero to a value that biases the pn-diode at the pn-diode junction 13 in a forward direction. The voltage increase of the second voltage V2 raises the levels of the Fermi-energy 60, the conducting band 62 and the valence band 63 in the n-type semiconductor region 11 with respect to the levels to the p-type semiconductor region 7 accordingly. As a result, the potential barrier in the pn-diode depletion region 14 is reduced such that an electron current flowing from the n-type semiconductor region 11 to the p-type semiconductor region 7, and a hole current flowing from the p-type semiconductor region 7 to the n-type semiconductor region 11 is initiated. This charge transport is identical to the charge flow of a forward biased pn-diode.

The electrons passing through the pn-diode depletion region 14 enter into the non-depleted p-type portion 18 where they randomly diffuse until they either recombine with a hole or reach the depleted p-type emitter region 20. The electric field in depleted p-type emitter region 20 accelerates the electrons toward the apex 10 of the emitter tip 9 where they can tunnel through the potential barrier 65 with the potential barrier thickness T. Once they have tunneled through the potential barrier 65 the electrons are emitted into free space 27, which preferably is a vacuum, and accelerated toward the extracting electrode 5.

Preferably the first voltage V1 is so high that the electron tunneling rate through the potential barrier 65 is much higher than the rate at which electrons pass through the pn-diode depletion region 14. Preferably the first voltage V1 is also so high that the electron tunneling rate through the potential barrier 65 is much higher than the rate at which electrons are generated in the non-depleted p-type portion 18 or in the depleted p-type emitter region 20. In this case the electron beam device is operated in the saturation mode. The advantage of operating the electron beam device in the saturation mode is that the emission current is limited by the electron current initiated by the forward biased voltage. This way, small fluctuations in the potential barrier level 65 due to chemical or physical changes of the very sensitive apex 10 of the emitter tip 9 have no or only little influence on the electron emission current. Since it is much easier to electrically control the potential barrier of a pn-diode junction 13 than to control the potential barrier of a vacuum level 61 at the surface of an apex 10 at very high electric fields, it is much easier to control the current of emitted electrons 65 by means of second voltage V2.

In addition, the adjustment of the electron emission current 65 can be performed with only small changes of the voltage, e.g. within −1V and +1V, while the same adjustment of the electron emission current 65 by the first voltage V1 had to be performed with much higher voltage changes. Such high voltage changes between the extracting electrode 5 and the emitter tip 9 can severely disturb the beam optics of electron beam devices where the electron beam has to be carefully directed and focussed, like e.g. with electron microscopes or electron beam pattern generators.

Figure 8A:
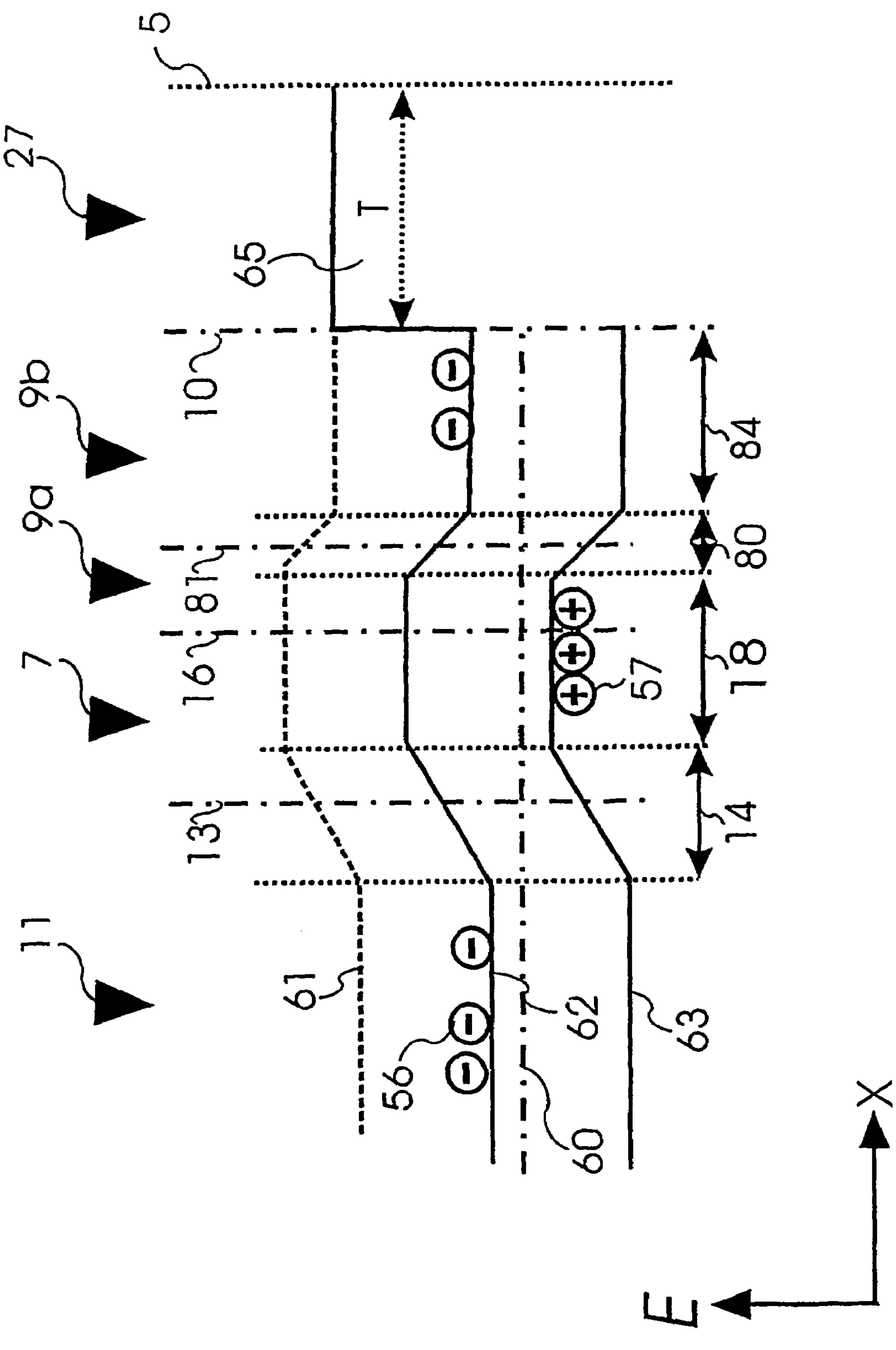
FIGS. 8*a-c* show schematically a method to generate an electron beam with an electron beam device according to the invention, whereby a portion of the emitter tip is n-type material.
Figure 8B:
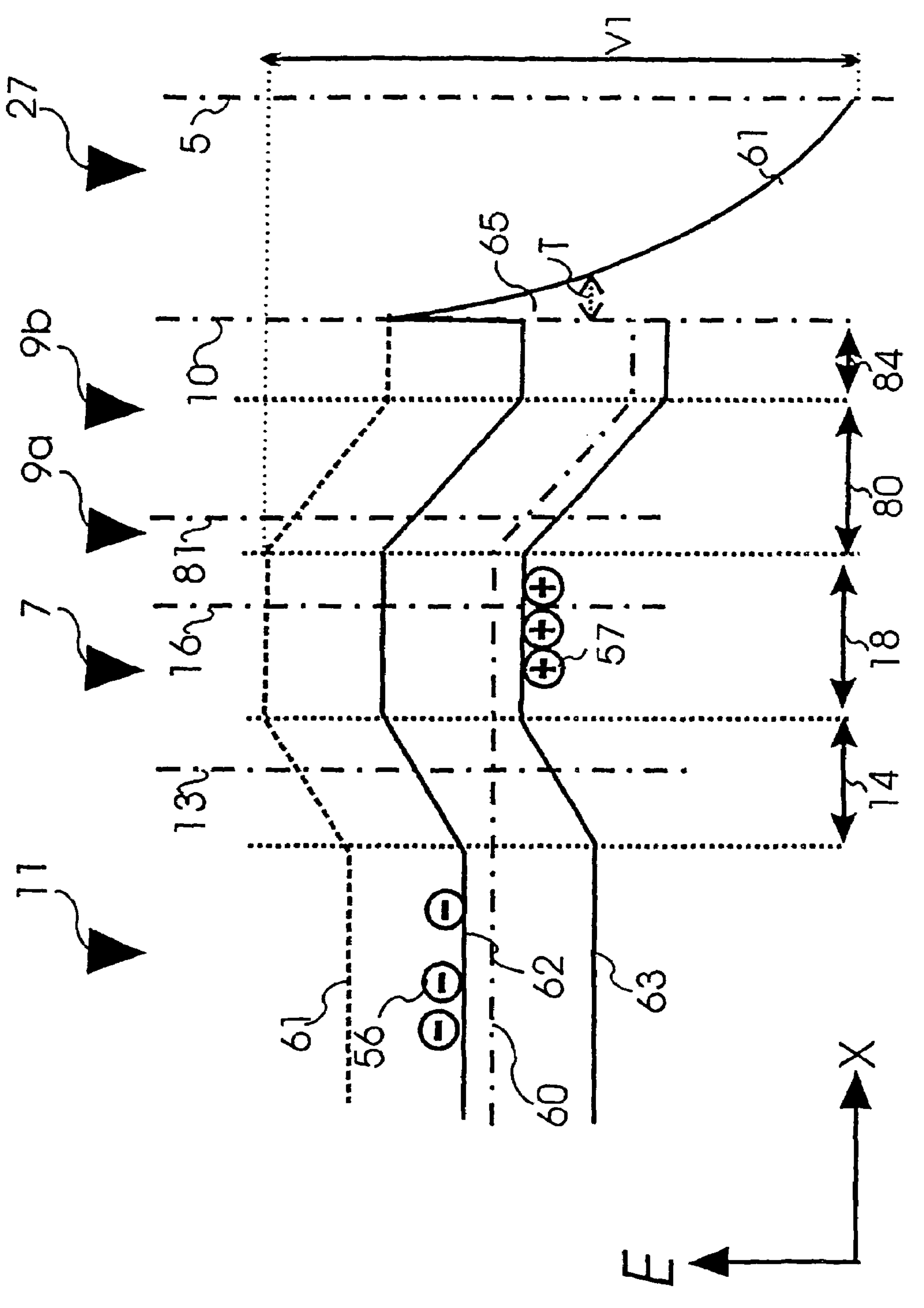
Figure 8C:
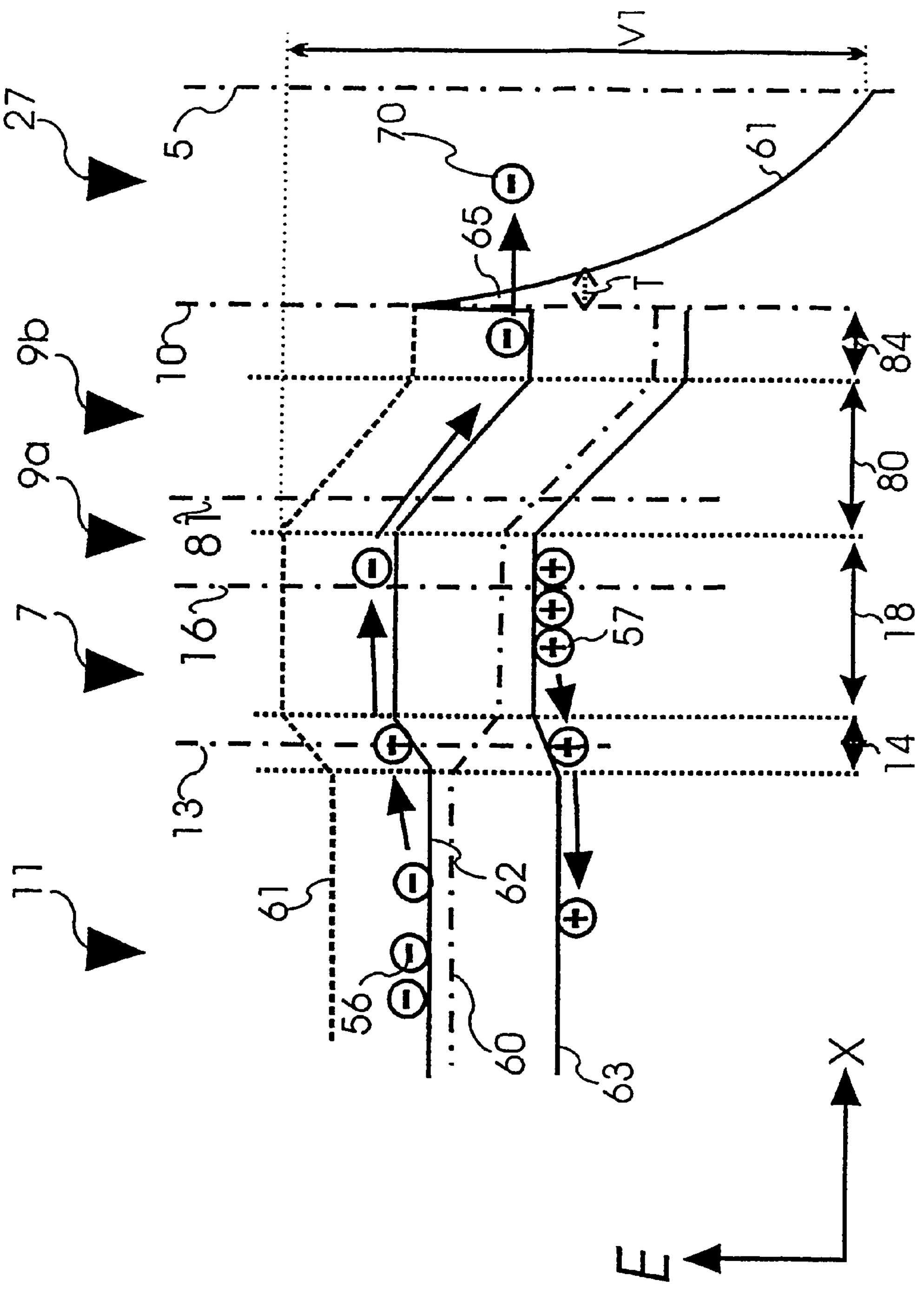

In FIG. 8*a* to 8*c* a second set of position-energy plots is shown which schematically illustrates the underlying physical model as they are thought to be valid for the electron emission of electron beam devices, using field emission cathodes like in FIG. 4*a*. The physical model shown in FIG. 8*a* to 8*c* serves to explain some features of the invention, however FIG. 8*a* to 8*c* are not meant to describe the devices according to the invention to the full extent.

On the left side of the position-energy plot of FIG. 8*a* there is the n-type semiconductor region 11 which extends to the pn-diode junction 13. Following the pn-diode junction 13, there is the p-type semiconductor region 17 which extends to the emitter tip base 16. The p-type doping level however continues into the emitter p-type region 9*a* to the second pn-diode junction 81. Following the second pn-diode depletion zone 80 to the apex 10 of the emitter tip 9 comes the emitter n-type region 9*b*. Without an external electric field, electrons are the majority carriers in the n-type semiconductor region 11 and the emitter n-type region 9*b*, as indicated by the free electrons 56 drawn above the lower edge of the conducting band 62; meanwhile, holes are the majority carriers in the non-depleted p-type portion 18. To the right of the apex position 10 there is free space 27, which preferably is at a good vacuum, and which reaches to the extracting electrode 5. Between apex 10 and extracting electrode 5 is the potential barrier 65 with the potential barrier thickness T. The potential barrier thickness T is given by the distance between apex 10 and extracting electrode 5. Due to the absence of a first voltage V1 and the thickness T of the potential barrier 65 there are no electrons tunneling through the potential barrier 65 from the apex of the emitter tip 10 to the extracting electrode 5.

FIG. 8*b* shows the position-energy plot of FIG. 8*a* with the first voltage V1 switched on. The increase of the first voltage V1, which is positive with respect to the emitter tip, increases the second pn-diode depletion zone 80. Preferably, the second pn-diode depletion zone 80 is depleted until it reaches the apex of the emitter tip 10. In this case, the energy of the electrons passing through the potential barrier is essentially given by the first voltage V1. If the second pn-diode depletion zone 80 is fully depleted up to the apex 10 as shown in FIG. 8*b*, the maximum value of the potential barrier 65 with respect to the voltage of the p-type semiconductor region 7 may be significantly lowered due to the voltage drop across the second pn-diode depletion zone 80. The voltage drop however can be minimized by either making the emitter n-type region very thin, preferably less than a few tens of nanometers, or making the n-type doping very low, preferably less than $10^{14}$ $1/cm^2$. Like in FIG. 7*a* or 7*b*, the large first voltage V1 reduces the thickness T of the potential barrier 65 to the level that free electrons near the apex 10 could easily tunnel through into free space 27. This corresponds to an external electric field strength larger than $10^6$ V/m. Preferably the first voltage V1 is so high that the emitter n-type region 9*b* is completely depleted of free electrons 56.

To be completely depleted, the potential barrier thickness, T, must be thin enough that the electron emission rate is larger than the leakage current in the second pn-diode junction zone 80. Otherwise, the free electrons 56 generated in the second pn-diode junction zone 80 would prevent complete depletion of this region.

FIG. 8*c* shows the position-energy plot of FIG. 8*b* with the second voltage V2 is applying a forward biasing voltage across the pn-diode junction 13 formed by the n-type semiconductor region 11 and the p-type semiconductor region 7. As a result the free electrons 56 can surmount the potential barrier of the pn-diode depletion zone 14 to be injected into the non-depleted p-type portion 18. There they travel randomly until they reach the depleted emitter n-type region 9*b* to drift to the apex 10 of the emitter tip 9. When the rate of electron emission through the potential barrier 65 is higher than the electron current injected into the non-depleted p-type portion 18, the electron emission current can be fully controlled by the second voltage V2 (saturation mode).

Figure 9:
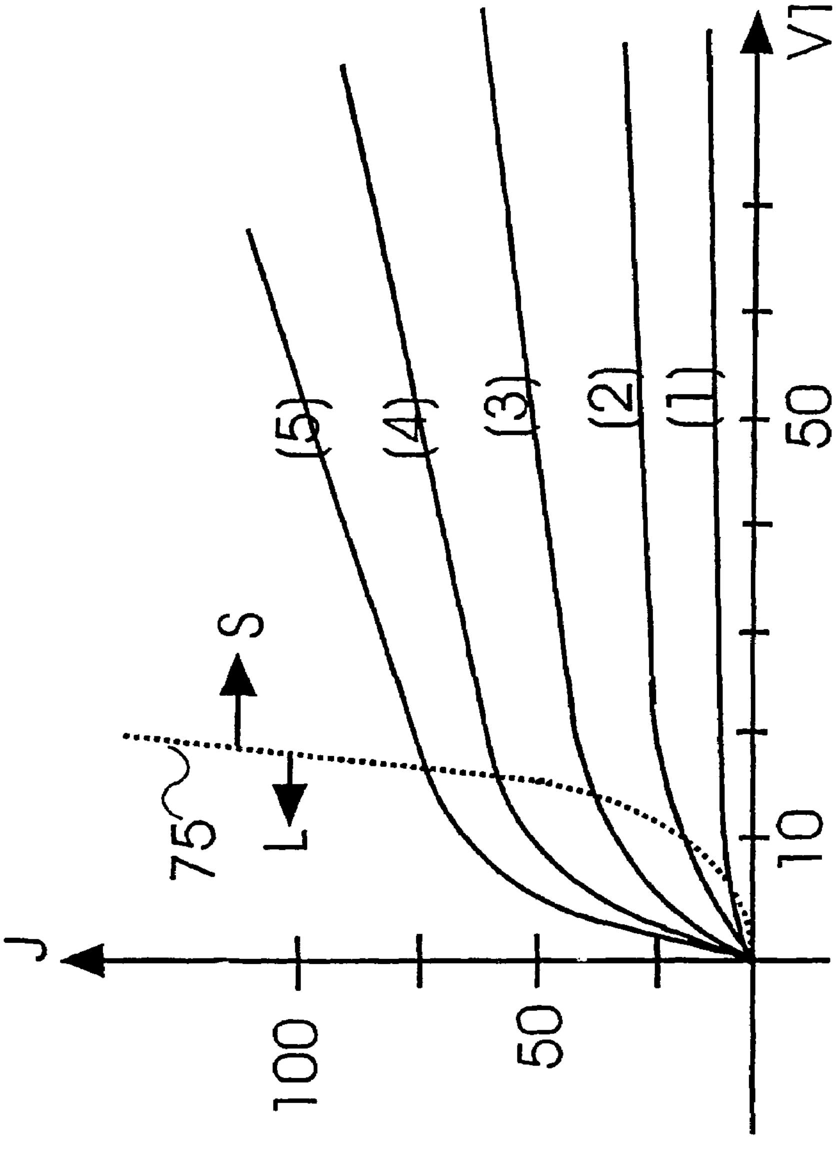
FIG. 9 shows a field of current-voltage curves of an electron beam device according to the invention.

In FIG. 9 a field of current-voltage curves of an electron beam device according to the invention is shown. They resemble in many ways the current-voltage curves of bipolar npn-transistors. In the vertical direction, the electron emission current, J, is shown; in the horizontal direction the first voltage, V1, between the extracting electrode 5 and p-type semiconductor region 7 with emitter tip 9 is shown. The five curves, indicated by (1), (2), (3), (4) and (5), correspond to current-voltage curves with increasing second voltage values, which roughly lie between 0 V and 0.6 V.

The field of the five current-voltage curves can be divided into the linear region, L, to the left of the saturation threshold 75, and the saturated region, S, to the right of the saturation threshold 75. In the linear region, L, the electron emission current, J, depends strongly on the first voltage V1. In this region the electron beam current is limited by the rate at which free electrons tunnel through the vacuum potential barrier 65. Also slight changes of the shape of the vacuum potential barrier 65, e.g. by small amounts of polluting chemicals or emitter tip deformation at the apex 10, can significantly change the electron emission current, J. The linear region , L, therefore is problematic when a high stability of the electron emission current is needed.

In the saturation region, S, the first voltage V1 is so high that the potential barrier thickness, T, is reduced to the level that electrons can tunnel through the potential barrier at a high rate. In the saturation mode the electron tunneling rate is larger than the leakage current and larger than the electron current injected into the non-depleted p-type portion. In the saturation mode therefore, the electron beam current is limited by the rate at which free electrons are made available to the p-type semiconductor region 7 by electron injection through the pn-diode junction 13. As a consequence, changes of the shape of the vacuum potential barrier 65 have only little influence on the electron emission current. Since it is much easier to control the electron current through a pn-diode than the current through a vacuum potential barrier of a tiny apex of an emitter tip, a much higher electron emission current stability can be achieved.

In addition, in the saturation mode, the first voltage V1 between extracting electrode 5 and p-type semiconductor region 7 can kept constant since vacuum potential barrier changes due to pollution or deformation of the apex 10 of the emitter tip 9 have no or only little effect on the electron emission rate. A constant first voltage V1 is important for electron beam devices with precision beam optics, since there even slight changes of the voltages between extracting electrode 5 and emitter tip 9 influence the electron beam optics performance. A constant first voltage V1 is important for electron beam devices with a large array of field emission cathodes since they all can be operated with the same voltage V1.

The reason that the current-voltage curves of the electron beam device increase even in the saturation region is due to the fact that with increasing first voltage V1 the depleted regions in the emitter tip around the apex increases. An increased depletion zone around the apex of the emitter tip also increases the leakage current which in the saturation mode adds to the electron emission current.

In FIG. 10*a* to 10*d* several embodiments of electron beam devices with arrays of field emission cathodes according to the invention are shown.

Figure 10A:
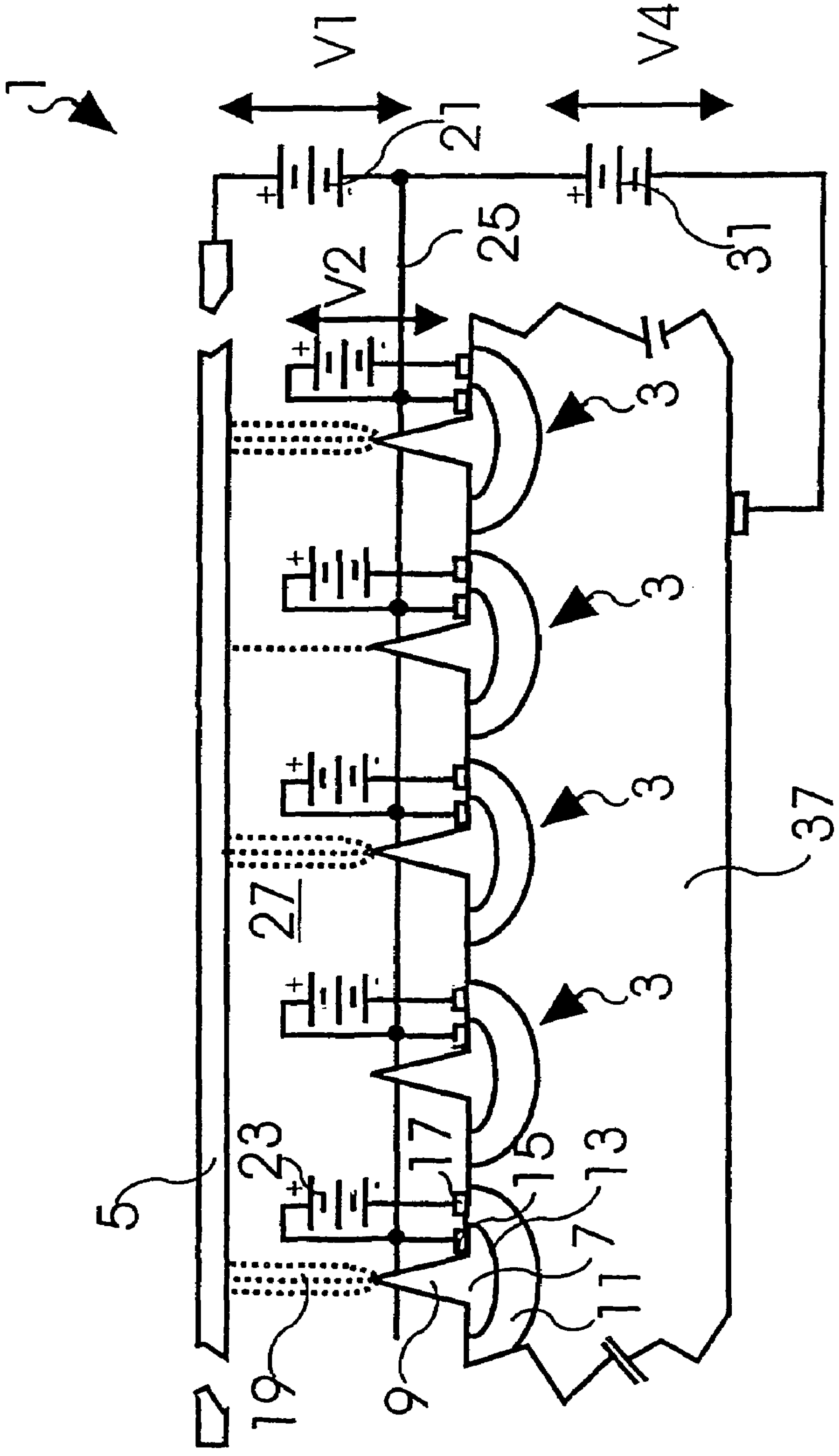
FIGS. 10*a-d* show schematically various embodiments of electron beam devices according to the invention with arrays of field emission cathodes and at least one extracting electrode.

In FIG. 10*a*, a segment of an electron beam device 1 with a segment of an array of field emission cathodes 3 integrated onto a semiconductor substrate 37 is shown. Preferably the semiconductor substrate 37 is silicon. In order to provide good electrical insulation between the individual n-type semiconductor regions 11 the semiconductor substrate 37 is a p-type semiconductor and preferably, its electric potential is more negative than any of the n-type semiconductor regions 11. In FIG. 10*a*, the electrical potential of the p-type semiconductor substrate 37 is provided by a fourth voltage source 31.

Each field emission cathode 3 of the array of field emission cathodes comprises an n-type semiconductor region 11 with a second electric contact 17, and a p-type semiconductor region 7 comprising an emitter tip 9 and a first electric contact 15. Both electric contacts, 15 and 17, preferably are ohmic contacts with a low resistance. Geometry and doping profile of the emitters, the p-type semiconductor region 7 and the n-type semiconductor region 11 is preferably comparable to the ones shown in FIG. 1*a*, FIG. 2*a*, FIG. 3*a* or FIG. 4*a*. Also in this embodiment of the invention, the size and doping profile of the p-type semiconductor regions 7 and the n-type semiconductor region 11 are preferably equal or very similar to each other in order to provide the same electron beam current values for the same voltages V1 and V2. Preferably, the region between the emitter tips 9 and the extracting electrode 5 is at a good vacuum 27 in order to avoid deterioration of the performance of the emitter tips 9. Preferably, the vacuum 27 is better than $10^{-6}$ mbar and preferably better than $10^{-8}$ mbar.

The electron beam device 1 further comprises an extracting electrode 5 which serves as an extracting electrode for the field emission cathodes 3. Therefore, in this embodiment, all emitter tips 9 see the same voltage at the extracting electrode 5. Further in this embodiment, the first voltage V1 between extracting electrode 5 and the p-type semiconductor region 7 is the same for all field emission cathodes 3. It is provided by the first voltage source 21, which is electrically connected to the p-type semiconductor regions 7 and the extracting electrode 5 through the conducting lines 25.

Preferably, the first voltage V1 is so high that the field emission cathodes 9 are operated in the saturation mode. In the saturation mode the electron beam current 19 is almost independent of changes of the voltage between emitter tip 9 and extracting electrode 5. This increases the stability of the electron beam currents 19.

In the saturation mode the current control is performed by the second voltage V2 between p-type semiconductor region 7 and n-type semiconductor region 11. For the same reason the current of the electron beam depends only a little or not at all on the detailed structure of the emitter tips 9. This fact is a significant improvement over traditional arrays of field emission devices. In the saturation mode the effect of unavoidable manufacturing variations of the emitter tips do not significantly influence the electron emission rate behavior. This makes it possible, e.g., to operate large arrays of field emission cathodes 3 with only one first voltage source 21 with a high degree of electron emission rate homogeneity.

The electron beam device 1 of FIG. 10*a* further comprises second voltage sources 23 for each field emission cathode 3 in order to provide individual second voltages V2 across each pn-diode junction 13. This way, in the saturation mode, the currents of the electron beams 19 can be individually controlled. This concept allows each field emission cathode to be addressed individually to, e.g. switch the electron beams 19 of each field emission cathode 3 either on or off or, increase or decrease the electron beams 19 of each field emission cathode 3 individually. Such electron beam devices may be useful for electron beam pattern generators where the array of electron beams 19 is used to structure a surface of a specimen with high throughput. It may also be useful for flat panel displays where a structure of different brightness is to be generated by the electron beams on a screen.

The conducting lines 25 and the second voltage sources 23 preferably are integrated on the semiconductor substrate 37 using micromechanical techniques. Preferably the second voltage sources 23 are each integrated right next to the corresponding field emission cathode 3. This saves space and avoids long conducting lines. However if the space between neighboring field emission cathodes 3 is too small, i.e. smaller than a few micrometers, there may not be enough space left to integrate the second voltage sources 23 right next to each field emission cathode 3. In this case the second voltage sources V2 are preferably integrated into the semiconductor substrate 37 outside the array of field emission cathodes or even outside the semiconductor substrate 37. In this case, the conducting lines 25 for each have to be led from the field emission cathodes 3 outside the array of field emission cathodes 3 in order to provide the electrical connections to the second voltage sources 23.

Figure 10B:
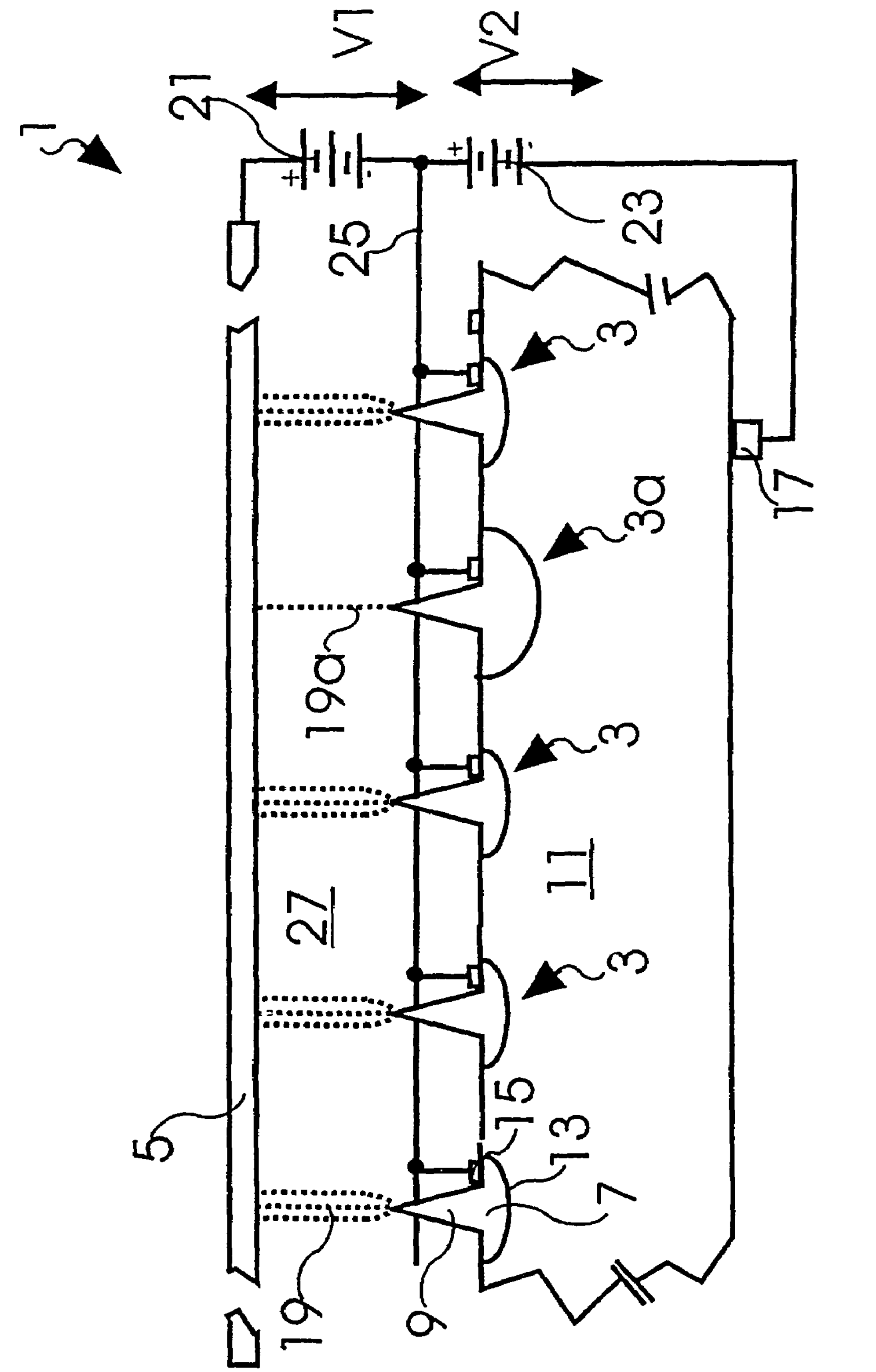

In FIG. 10*b* another embodiment of an electron beam device according to the invention is shown which is similar to the one shown in FIG. 10*a*. The main difference to the electron beam device shown in FIG. 10*a* is the omission of the individual n-type semiconductor regions 11 which instead have been merged with an n-type semiconductor substrate. As a consequence the n-type semiconductor regions 11 are electrically connected to each other and therefore are at the same electrical potential with respect to the p-type semiconductor regions 7. This design simplifies the complexity of the array of field emission cathodes considerably since only one second voltage source 23 has to be provided instead of one for each field emission cathode 3. For thousands or even millions of field emission cathodes 3 on a semiconductor substrate such a simplification can be decisive for the success of an application.

On the other hand, with only one second voltage source 23 for all field emission cathodes 3 there is no individual electron emission control possible any more. This may exclude the electron beam device 1 from some applications. However electron beam devices such as electron microscopes, which need parallel electron beams 19 with constant and possibly homogeneous electron beam currents, the simplification is useful. The simplification is also important when a packaging density of the field emission cathodes 3 is needed which does not allow for any circuitry between neighboring field emission cathodes 3.

In FIG. 10*b* an additional feature is shown which can be useful for some electron beam devices 1. In one of the field emission cathodes, i.e. the field emission cathode 3*a*, the p-type semiconductor region 7 has been increased in order to increase the minimum non-depleted p-type distance D (see FIG. 1*a*). As mentioned before the minimum non-depleted p-type distance D determines the fraction of the injected electrons that can be emitted into free space. By increasing the minimum non-depleted p-type distance D the current of the electron beam 19 of that field emission cathode 3 is reduced to a electron beam current 19*a*. Therefore, it is possible to have individual electron beam current values with only one second voltage source 23 using layout techniques. However the electron beam current values cannot be controlled individually during operation.

Figure 10C:
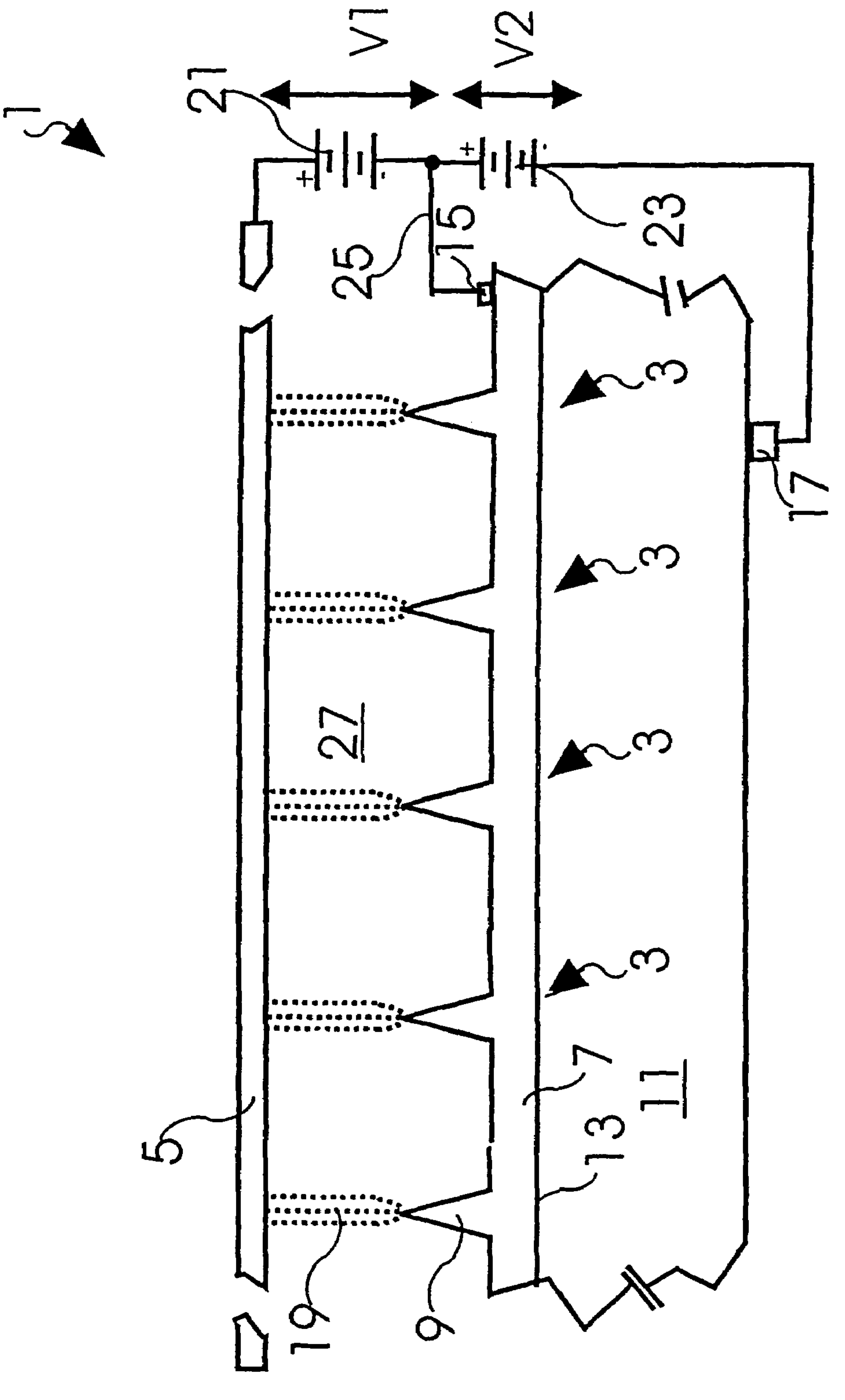

In FIG. 10*c* another embodiment of an electron beam device according to the invention is shown which is similar to the one shown in FIG. 10*b*. The main difference to the electron beam device shown in FIG. 10*b* is the merging of the individual p-type semiconductor regions 7 to one p-type layer 7. With the p-type semiconductor regions being one electrically conducting p-type semiconductor layer 7, only one first electric contact 15 and only one second electric contact 17 are needed to bias all pn-diodes of the array of field emission cathodes. This layout further increases the potential for increased packaging of the field emission cathodes since no conducting lines 25 are needed any more within the array of field emission cathodes. With this design it is possible to have a spacing between neighboring field emission cathodes of less than a micrometer.

In addition, an array of field emission cathodes like in FIG. 10*c* needs less manufacturing steps since the structuring of the p-type semiconductor regions or n-type semiconductor regions can be omitted. This helps to reduce costs and improves manufacturing yield.

Figure 10D:
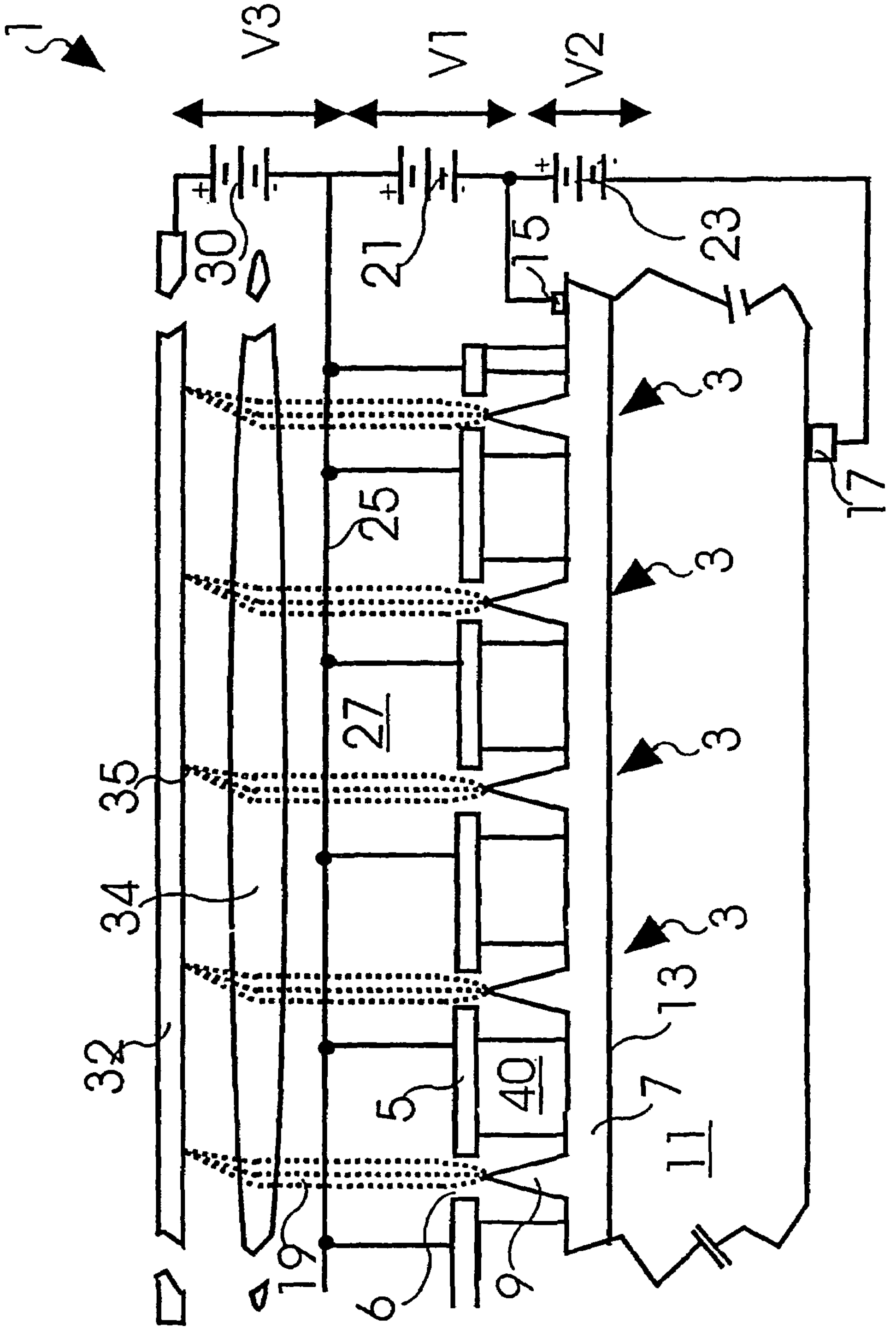

In FIG. 10*d* an electron beam device with an array of field emission cathodes 3 is shown which for the purpose of illustration combines many of the features mentioned in this description. Such a device can be used, e.g., for electron microscopes with high throughput, where arrays of electron beams 19 with a single well-determined electron beam current value have to be passed through focussing and directing components 34 onto e.g. a specimen. For such applications individual electron beam current control is not needed. Instead, high homogeneity of the electron beam currents and good current stability is appreciated.

Shown in FIG. 10*d* is an array of field emission cathodes 3 where the n-type semiconductor regions 11 have been merged with an n-type semiconductor substrate, and where the p-type semiconductor regions 7 have been merged to a p-type semiconductor layer 7. This design has already been described in FIG. 10*c*. It allows an array of electron beams 19 to be generated with high current homogeneity across the array, however without individual current control. Such a design allows the array pn-diodes of each field emission cathode 3 to be biased with only one second voltage source 23.

In addition, the extracting electrodes 5 have been integrated onto the substrate, preferably using microprocessing techniques. Using microprocessing techniques, the extracting electrodes 5 have been applied on a structured insulating layer 40. Microprocessing techniques allow the extracting electrodes 5 to be positioned very close to the emitter tips 9 with high precision. Using microprocessing techniques the distances between the apex of emitter tips 9 to the extracting electrodes 5 can be made as small as one micrometer or less. This allows the field emission cathodes 3 in the saturation mode to be operated at a moderate first voltage V1, e.g. less than 100 V. In addition, the high precision of microprocessing techniques allows the field emission cathodes 3 and extracting electrodes 5 to be fabricated with high geometric homogeneity across the array of field emission cathodes.

Preferably the extracting electrodes 5 are electrically connected to each other in a way that they are at the same electric potential. This can be achieved, e.g., by providing conducting lines between neighboring extracting electrodes 5. In another preferred embodiment, the extracting electrodes are made of a conducting layer with openings 6 at the positions of the emitter tips 9. This way the first voltage V1 between extracting electrodes 5 and p-type semiconductor regions 7 can be provided by a single first voltage source 21.

In addition to the extracting electrodes 5 an anode 32 is provided which preferably is at an electric potential more positive than the electric potential of the extracting electrodes 5. The anode 32 serves to guide the array of electron beams 19 through the openings 6 of the extracting electrodes 5 towards, e.g., the anode 32. The electric potential at the anode is provided by the third voltage source 30 which delivers a third voltage V3 between the extracting electrodes 5 and the anode 32.

In addition to the anode the focussing components 34 are shown which represent an optical system for the electron beams 19. The focussing components 34 usually comprise electric or magnetic components to direct or focus the electron beams 19. In this preferred embodiment of the present invention the array of electron beams 19 is focussed onto an array of focus positions 35 which in this embodiment is on a plane with the anode 32. It is a major advantage of the present invention that with an array of field emission cathodes 3 like in FIG. 10*d* a high current homogeneity is achieved. In addition, adjustments of the electron beam currents are being performed by changes of the second voltage V2 which do not affect the performance of the optical system represented by the focussing components 34.

From reading the present disclosure, other modifications and variations will be apparent to persons skilled in the art. Such modifications and variations may involve equivalent features and other features which are already known in the art and which may be used instead of or in addition to features already disclosed herein. Although claims have been formulated in this application to particular combinations of features, it should be understood that the scope of the disclosure of the present application includes any and every novel feature or any novel combination of features disclosed herein either explicitly or implicitly and any generalization thereof, whether or not it relates to the same invention as presently claimed in any claim and whether or not it mitigates any or all of the same technical problems as does the present invention.

The invention claimed is:

1. An electron beam device with a field emission cathode and an extracting electrode, wherein the field emission cathode comprises:

a p-type semiconductor region connected with an emitter tip made of semiconductor material, wherein an electron current entering the emitter tip flows through the p-type semiconductor region and a minimum non-depleted p-type distance D during operation is shorter than a diffusion length, $L_n$, of electrons in the p-type semiconductor region;

an n-type semiconductor region forming a pn-diode junction with the p-type semiconductor region;

a first electric contact on the p-type semiconductor region; and a second electric contact on the n-type semiconductor region.

2. The electron beam device according to claim 1, wherein the electron current entering the emitter tip flows through a non-depleted p-type portion.

3. The electron beam device according to claim 1, wherein the emitter tip is made of p-type material.

4. The electron beam device according to claim 1, wherein a positive first voltage (V1) between the extracting electrode and the first electric contact is provided.

5. The electron beam device according to claim 1, wherein a forward biasing second voltage (V2) between the first electric contact and the second electric contact is provided.

6. The electron beam device according to claim 1, wherein the field emission cathode is integrated onto a semiconductor substrate.

7. The electron beam device according to claim 6, wherein the extracting electrode is integrated onto the semiconductor substrate.

8. The electron beam device according to claim 1, wherein the extracting electrode has an opening through which an emitted electrons beam can pass.

9. The electron beam device according to claim 1, wherein focusing components focus the electron beam.

10. The electron beam device according to claim 1, wherein the emitter tip is coated with coating material.

11. An electron beam device comprising an array of field emission cathodes with an array extraction electrodes according to claim 1.

12. The electron beam device according to claim 11, wherein the array of field emission cathodes is integrated onto a substrate.

13. The electron beam device according to claim 11, wherein the extracting electrodes are electrically connected with each other.

14. The electron beam device according to claim 11, wherein the n-type semiconductor regions are electrically connected with each other.

15. The electron beam device according to claim 11, wherein the p-type semiconductor regions are electrically connected with each other.

16. The electron beam device according to claim 11, wherein the p-type semiconductor regions are doped silicon material.

17. A field emission cathode comprising:

a p-type semiconductor region connected with an emitter tip made of semiconductor material, wherein an electron current entering the emitter tip flows through the p-type semiconductor region and a minimum non-depleted p-type distance D during operation is shorter than a diffusion length, $L_n$, of electrons in the p-type semiconductor region;

an n-type semiconductor region forming a pn-diode junction with the p-type semiconductor region;

a first electric contact on the p-type semiconductor region; and a second electric contact on the n-type semiconductor region.

18. The field emission cathode according to claim 17, wherein the electron current entering the emitter tip flows through a non-depleted p-type portion.

19. Field emission cathode according to claim 17, wherein the emitter tip is made of p-type semiconductor material.

20. Field emission cathode according to claim 17, wherein the field emission cathode is integrated with a semiconductor substrate.

21. Field emission cathode according to claim 20, wherein an extracting electrode is integrated onto the semiconductor substrate.

22. Field emission cathode according to claim 21, wherein the extracting electrode has an opening through which an emitted electrons beam can pass.

23. Field emission cathode according to claim 17, wherein the emitter tip is coated with coating material.

24. An array of field emission cathodes comprising field emission cathodes according to claim 17.

25. The array of field emission cathodes according to claim 24, wherein the array of field emission cathodes is integrated onto a substrate.

26. The array of field emission cathodes according to claim 24, wherein the extracting electrodes are electrically connected with each other.

27. The array of field emission cathodes according to claim 24, wherein the n-type semiconductor regions are electrically connected with each other.

28. The array of field emission cathodes according to claim 24, wherein the p-type semiconductor regions are electrically connected with each other.

29. The electron beam device according to claim 1, wherein the minimum non-depleted p-type distance D during operation is 10 times shorter than the diffusion length, $L_n$, of electrons in the p-type semiconductor region.

30. The field emission cathode according to claim 17, wherein the minimum non-depleted p-type distance D during operation is 10 times shorter than the diffusion length, $L_n$, of electrons in the p-type semiconductor region.

* * * * *

UNITED STATES PATENT AND TRADEMARK OFFICE

CERTIFICATE OF CORRECTION

PATENT NO. : 7,268,361 B2
APPLICATION NO. : 10/483114
DATED : September 11, 2007
INVENTOR(S) : Pavel Adamec and Dieter Winkler It is certified that error appears in the above-identified patent and that said Letters Patent is hereby corrected as shown below:

Column 3, line 24, Delete “fourth” and insert --third-- therefor

Column 3, line 27, Delete “sixth” and insert --fourth-- therefor

Column 3, line 29, Delete “23” and insert --24-- therefor

Column 4, line 50, Delete “tree” and insert --free-- therefor

Signed and Sealed this

Twentieth Day of May, 2008

JON W. DUDAS
*Director of the United States Patent and Trademark Office*